United States Patent
Pesavento et al.

(10) Patent No.: US 8,111,558 B2
(45) Date of Patent: *Feb. 7, 2012

(54) PFET NONVOLATILE MEMORY

(75) Inventors: Alberto Pesavento, Seattle, WA (US); John D. Hyde, Corvallis, OR (US)

(73) Assignee: Synopsys, Inc., Mountain View, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 11/865,777

(22) Filed: Oct. 2, 2007

(65) Prior Publication Data

US 2008/0175050 A1 Jul. 24, 2008

Related U.S. Application Data

(63) Continuation-in-part of application No. 11/237,099, filed on Sep. 28, 2005, now Pat. No. 7,283,390, which is a continuation-in-part of application No. 10/839,985, filed on May 5, 2004, now Pat. No. 7,221,596.

(51) Int. Cl.
*G11C 11/34* (2006.01)
(52) U.S. Cl. .......... 365/185.28; 365/185.21; 365/185.18
(58) Field of Classification Search ............ 365/185.28, 365/185.21, 185.18, 207, 189.09, 189.07, 365/185.26, 104, 149, 185.24
See application file for complete search history.

(56) References Cited

U.S. PATENT DOCUMENTS

| | | |
|---|---|---|
| 4,090,258 A | 5/1978 | Cricchi |
| 4,132,904 A | 1/1979 | Harari |
| 4,158,239 A | 6/1979 | Bertin |
| 4,384,288 A | 5/1983 | Walton |
| 4,388,524 A | 6/1983 | Walton |
| 4,541,073 A | 9/1985 | Brice et al. |
| 4,546,241 A | 10/1985 | Walton |
| 4,571,704 A | 2/1986 | Bohac, Jr. |
| 4,575,823 A | 3/1986 | Fitzpatrick |

(Continued)

FOREIGN PATENT DOCUMENTS

EP 0 298 618 1/1989

(Continued)

OTHER PUBLICATIONS

Carley, L Richard, "Trimming Analog Circuits Using Floating-Gate Analog MOS Memory", IEEE Journal of Solid-State Circuits, vol. 24, No. 6, Dec. 1989, pp. 1569-1575.

(Continued)

*Primary Examiner* — Dang Nguyen
(74) *Attorney, Agent, or Firm* — Fenwick & West LLP

(57) ABSTRACT

A nonvolatile memory cell is constructed using a floating-gate pFET readout transistor having its source tied to a power source (Vdd) and its drain providing a current, which can be sensed to determine the state of the cell. The gate of the pFET readout transistor provides for charge storage, which can be used to represent information such as binary bits. A control capacitor coupled between a first voltage source and the floating gate and a tunneling capacitor between a second voltage source and the floating gate are fabricated so that the control capacitor has much more capacitance than the tunneling capacitor. Manipulation of the voltages applied to the first voltage source and second voltage source controls an electric field across the capacitor structure and pFET dielectrics and thus Fowler-Nordheim tunneling of electrons on and off the floating gate, controlling the charge on the floating gate and the information stored thereon.

18 Claims, 16 Drawing Sheets

U.S. PATENT DOCUMENTS

| | | | |
|---|---|---|---|
| 4,580,041 A | 4/1986 | Walton | |
| 4,758,869 A | 7/1988 | Eitan et al. | |
| 4,935,702 A | 6/1990 | Mead et al. | |
| 4,953,928 A | 9/1990 | Anderson et al. | |
| 5,018,102 A | 5/1991 | Houston | |
| 5,068,622 A | 11/1991 | Mead et al. | |
| 5,086,331 A | 2/1992 | Hartgring et al. | |
| 5,124,568 A | 6/1992 | Chen et al. | |
| 5,146,106 A | 9/1992 | Anderson et al. | |
| 5,168,464 A | 12/1992 | Stanchak et al. | |
| 5,272,368 A | 12/1993 | Turner et al. | |
| 5,301,150 A | 4/1994 | Sullivan et al. | |
| 5,323,066 A | 6/1994 | Feddeler et al. | |
| 5,361,001 A | 11/1994 | Stolfa | |
| 5,384,727 A | 1/1995 | Moyal et al. | |
| 5,394,367 A | 2/1995 | Downs et al. | |
| 5,412,594 A | 5/1995 | Moyal et al. | |
| 5,430,670 A | 7/1995 | Rosenthal | |
| 5,438,542 A | 8/1995 | Atsumi et al. | |
| 5,463,348 A | 10/1995 | Sarpeshkar et al. | |
| 5,504,707 A | 4/1996 | Koizumi | |
| 5,517,044 A | 5/1996 | Koyama | |
| 5,541,878 A | 7/1996 | LeMoncheck et al. | |
| 5,596,524 A | 1/1997 | Lin et al. | |
| 5,616,942 A | 4/1997 | Song | |
| 5,617,358 A | 4/1997 | Kodama | |
| 5,623,442 A | 4/1997 | Gotou et al. | |
| 5,627,392 A | 5/1997 | Diorio et al. | |
| 5,633,518 A | 5/1997 | Broze | |
| 5,650,966 A | 7/1997 | Cleveland et al. | |
| 5,659,498 A | 8/1997 | Pascucci et al. | |
| 5,666,307 A | 9/1997 | Chang | |
| 5,677,917 A | 10/1997 | Wheelus et al. | |
| 5,687,118 A | 11/1997 | Chang | |
| 5,691,939 A | 11/1997 | Chang et al. | |
| 5,706,227 A | 1/1998 | Chang et al. | |
| 5,717,636 A | 2/1998 | Dallabora et al. | |
| 5,729,155 A | 3/1998 | Kobatake | |
| 5,731,716 A | 3/1998 | Pascucci | |
| 5,736,764 A | 4/1998 | Chang | |
| 5,754,471 A | 5/1998 | Peng et al. | |
| 5,761,121 A | 6/1998 | Chang | |
| 5,763,912 A | 6/1998 | Parat et al. | |
| 5,777,361 A | 7/1998 | Parris et al. | |
| 5,777,926 A | 7/1998 | Trinh et al. | |
| 5,786,617 A | 7/1998 | Merrill et al. | |
| 5,790,060 A | 8/1998 | Tesch | |
| 5,796,656 A | 8/1998 | Kowshik et al. | |
| 5,798,967 A | 8/1998 | Sarin et al. | |
| 5,801,994 A | 9/1998 | Chang et al. | |
| 5,822,714 A | 10/1998 | Cato | |
| 5,825,063 A | 10/1998 | Diorio et al. | |
| 5,835,402 A | 11/1998 | Rao et al. | |
| 5,841,165 A | 11/1998 | Chang et al. | |
| 5,844,300 A | 12/1998 | Alavi et al. | |
| 5,854,762 A | 12/1998 | Pascucci | |
| 5,875,126 A * | 2/1999 | Minch et al. | 365/185.01 |
| 5,886,566 A | 3/1999 | Park et al. | |
| 5,890,199 A | 3/1999 | Downs | |
| 5,892,709 A | 4/1999 | Parris et al. | |
| 5,892,712 A | 4/1999 | Hirose et al. | |
| 5,898,613 A | 4/1999 | Diorio et al. | |
| 5,901,084 A | 5/1999 | Ohnakado | |
| 5,912,841 A | 6/1999 | Kim | |
| 5,912,842 A | 6/1999 | Chang et al. | |
| 5,912,937 A | 6/1999 | Goetting et al. | |
| 5,914,894 A | 6/1999 | Diorio et al. | |
| 5,914,895 A | 6/1999 | Jenne | |
| 5,939,945 A | 8/1999 | Thewes et al. | |
| 5,966,329 A | 10/1999 | Hsu et al. | |
| 5,969,987 A | 10/1999 | Blyth et al. | |
| 5,972,804 A | 10/1999 | Tobin et al. | |
| 5,982,669 A | 11/1999 | Kalnitsky et al. | |
| 5,986,927 A * | 11/1999 | Minch et al. | 365/185.01 |
| 5,990,512 A | 11/1999 | Diorio et al. | |
| 6,011,425 A | 1/2000 | Oh et al. | |
| 6,028,789 A | 2/2000 | Mehta et al. | |
| 6,049,229 A | 4/2000 | Manohar et al. | |
| 6,055,185 A | 4/2000 | Kalnitsky et al. | |
| 6,060,919 A | 5/2000 | Wilson et al. | |
| 6,081,451 A | 6/2000 | Kalnitsky et al. | |
| 6,111,785 A | 8/2000 | Hirano | |
| 6,125,053 A | 9/2000 | Diorio et al. | |
| 6,137,721 A | 10/2000 | Kalnitsky et al. | |
| 6,137,722 A | 10/2000 | Kalnitsky et al. | |
| 6,137,723 A | 10/2000 | Bergemont et al. | |
| 6,137,724 A | 10/2000 | Kalnitsky et al. | |
| 6,141,247 A | 10/2000 | Roohparvar et al. | |
| 6,144,581 A | 11/2000 | Diorio et al. | |
| 6,151,238 A | 11/2000 | Smit et al. | |
| 6,166,954 A | 12/2000 | Chern | |
| 6,166,978 A | 12/2000 | Goto | |
| 6,190,968 B1 | 2/2001 | Kalnitsky et al. | |
| 6,208,557 B1 | 3/2001 | Bergemont et al. | |
| 6,214,666 B1 | 4/2001 | Mehta | |
| 6,222,765 B1 | 4/2001 | Nojima | |
| 6,222,771 B1 | 4/2001 | Tang et al. | |
| 6,236,223 B1 | 5/2001 | Brady et al. | |
| 6,252,802 B1 | 6/2001 | Kramer et al. | |
| 6,294,427 B1 | 9/2001 | Furuhata et al. | |
| 6,294,810 B1 | 9/2001 | Li et al. | |
| 6,294,997 B1 | 9/2001 | Paratore et al. | |
| 6,320,788 B1 | 11/2001 | Sansbury et al. | |
| 6,331,949 B1 | 12/2001 | Hirano | |
| 6,363,006 B2 | 3/2002 | Naffziger et al. | |
| 6,363,011 B1 | 3/2002 | Hirose et al. | |
| 6,384,451 B1 | 5/2002 | Caywood | |
| 6,385,000 B1 | 5/2002 | Ottesen et al. | |
| 6,385,090 B1 | 5/2002 | Kitazaki | |
| 6,400,622 B1 | 6/2002 | Fujiwara | |
| 6,411,545 B1 | 6/2002 | Caywood | |
| 6,452,835 B1 | 9/2002 | Diorio et al. | |
| 6,456,992 B1 | 9/2002 | Shibata et al. | |
| 6,469,930 B1 | 10/2002 | Murray | |
| 6,469,937 B2 | 10/2002 | Fuchigami et al. | |
| 6,477,103 B1 | 11/2002 | Nguyen et al. | |
| 6,479,863 B2 | 11/2002 | Caywood | |
| 6,515,919 B1 | 2/2003 | Lee | |
| 6,529,407 B2 | 3/2003 | Shukuri | |
| 6,534,816 B1 | 3/2003 | Caywood | |
| 6,538,468 B1 | 3/2003 | Moore | |
| 6,563,731 B1 | 5/2003 | Bergemont | |
| 6,573,765 B2 | 6/2003 | Bales et al. | |
| 6,590,825 B2 | 7/2003 | Tran et al. | |
| 6,611,463 B1 | 8/2003 | Mehta et al. | |
| 6,633,188 B1 | 10/2003 | Jia et al. | |
| 6,641,050 B2 | 11/2003 | Kelley et al. | |
| 6,646,919 B1 | 11/2003 | Madurawe et al. | |
| 6,654,272 B2 | 11/2003 | Santin et al. | |
| 6,661,278 B1 | 12/2003 | Gilliland | |
| 6,664,909 B1 | 12/2003 | Hyde et al. | |
| 6,678,190 B2 | 1/2004 | Yang et al. | |
| 6,693,819 B2 | 2/2004 | Smith et al. | |
| 6,724,657 B2 | 4/2004 | Shukuri | |
| 6,741,500 B2 | 5/2004 | DeShazo et al. | |
| 6,822,894 B1 | 11/2004 | Costello et al. | |
| 6,845,029 B2 | 1/2005 | Santin et al. | |
| 6,853,583 B2 * | 2/2005 | Diorio et al. | 365/185.21 |
| 6,898,123 B2 | 5/2005 | Owen | |
| 6,903,436 B1 | 6/2005 | Luo et al. | |
| 6,909,389 B1 | 6/2005 | Hyde et al. | |
| 6,946,892 B2 | 9/2005 | Mitarashi | |
| 6,950,342 B2 * | 9/2005 | Lindhorst et al. | 365/185.21 |
| 6,954,383 B2 | 10/2005 | Chiu et al. | |
| 7,046,549 B2 | 5/2006 | Lee et al. | |
| 7,106,642 B2 | 9/2006 | Hojo | |
| 7,177,182 B2 | 2/2007 | Diorio et al. | |
| 7,212,446 B2 * | 5/2007 | Diorio et | 365/185.21 |
| 7,221,596 B2 * | 5/2007 | Pesavento et al. | 365/185.21 |
| 7,283,390 B2 | 10/2007 | Pesavento | |
| 7,307,534 B2 | 12/2007 | Pesavento | |
| 7,388,420 B2 | 6/2008 | Diorio et al. | |
| 7,483,310 B1 * | 1/2009 | Bu | 365/185.26 |
| 7,573,749 B2 | 8/2009 | Diorio et al. | |
| 7,679,957 B2 * | 3/2010 | Ma et al. | 365/185.09 |
| 2001/0035216 A1 | 11/2001 | Kyle | |
| 2001/0035816 A1 | 11/2001 | Beigel et al. | |

| | | | |
|---|---|---|---|
| 2002/0008271 A1 | 1/2002 | Hsu et al. | |
| 2002/0020871 A1 | 2/2002 | Forbes | |
| 2002/0122331 A1 | 9/2002 | Santin et al. | |
| 2003/0123276 A1 | 7/2003 | Yokozeki | |
| 2003/0183871 A1 | 10/2003 | Dugger et al. | |
| 2003/0206437 A1 | 11/2003 | Diorio et al. | |
| 2003/0218925 A1 | 11/2003 | Torjussen et al. | |
| 2003/0222309 A1 | 12/2003 | Roy et al. | |
| 2004/0004861 A1 | 1/2004 | Srinivas et al. | |
| 2004/0017295 A1 | 1/2004 | Dishongh et al. | |
| 2004/0021166 A1 | 2/2004 | Hyde et al. | |
| 2004/0021170 A1 | 2/2004 | Caywood | |
| 2004/0037127 A1 | 2/2004 | Lindhorst et al. | |
| 2004/0052113 A1 | 3/2004 | Diorio et al. | |
| 2004/0080982 A1 | 4/2004 | Roizin | |
| 2004/0136245 A1 | 7/2004 | Makamura et al. | |
| 2004/0195593 A1 | 10/2004 | Diorio et al. | |
| 2004/0206999 A1 | 10/2004 | Hyde et al. | |
| 2004/0240278 A1* | 12/2004 | Brady et al. | 365/189.09 |
| 2004/0263319 A1 | 12/2004 | Huomo | |
| 2005/0030827 A1* | 2/2005 | Gilliland et al. | 365/232 |
| 2005/0149896 A1 | 7/2005 | Madurawe | |
| 2005/0219931 A1 | 10/2005 | Diorio et al. | |
| 2005/0251617 A1 | 11/2005 | Sinclair et al. | |
| 2006/0123186 A1 | 6/2006 | Loh et al. | |
| 2006/0133140 A1 | 6/2006 | Gutnik et al. | |
| 2006/0133175 A1 | 6/2006 | Gutnik et al. | |
| 2006/0221715 A1 | 10/2006 | Ma et al. | |
| 2007/0252701 A1 | 11/2007 | Berry et al. | |
| 2007/0263456 A1 | 11/2007 | Wang et al. | |
| 2008/0112238 A1 | 5/2008 | Kim et al. | |

FOREIGN PATENT DOCUMENTS

| | | |
|---|---|---|
| EP | 0 326 883 | 8/1989 |
| EP | 0 336 500 | 10/1989 |
| EP | 0 756 379 | 1/1997 |
| EP | 0 776 049 | 5/1997 |
| EP | 0 778 623 | 6/1997 |
| JP | S54-017655 A | 2/1979 |
| JP | S59-054100 A | 3/1984 |
| JP | S60-071582 | 1/1986 |
| JP | H11-510315 A | 7/1996 |
| JP | H09-181204 A | 7/1997 |
| WO | WO 01/26113 A1 | 4/2001 |
| WO | WO 2005/106893 A1 | 11/2005 |

OTHER PUBLICATIONS

Chang, L. et al., "Non-Volatile Memory Device With True CMOS Compatibility", Electronics Letters, vol. 35, No. 17, Aug. 19, 1999, pp. 1443-1445.
Chang, Leland et al., "A CMOS-Compatible Single-Poly Cell for Use As Non-Volatile Memory", International Semiconductor Device Research Symposium, Dec. 1-3, 1999, pp. 57-60.
Chung, S.S. et al., "N-Channel Versus P-Channel Flash EEPROM-Which One Has Better Reliabilities", 39th Annual IEEE International Reliability Physics Symposium, 2001, pp. 67-72.
Declercq et al., "Design and Optimization of High-Voltage CMOS Devices Compatible with a Standard 5 V CMOS Technology", IEEE Custom Integrated Circuits Conference, 1993, pp. 24.6.1-24.6.4.
Dickson, "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.
Diorio, C. et al., "A High-Resolution Non-Volatile Analog Memory Cell", IEEE International Symposium on Circuits and Systems, vol. 3, 1995, pp. 2233-2236.
Diorio, C. et al., "A Floating-Gate MOS Learning Array with Locally Computed Weight Updates" IEEE Transactions on Electron Devices, vol. 44, No. 12, Dec. 1997, pp. 1-10.
Diorio, C., "A p-Channel MOS Synapse Transistor with Self-Convergent Memory Writes", IEEE Transaction on Electron Devices, vol. 47, No. 2, Feb. 2000, pp. 464-472.
Herdt, C. et al., "Analysis, Measurement, and Simulation of Dynamic Write Inhibit in an nvSRAM Cell", IEEE Transactions on Electron Devices, vol. 39, No. 5, May 1992, pp. 1191-1196.
IBM Technical Disclosure Bulletin, "Fuse Circuit With Zero DC Current", IBM Corporation, Jul. 1987, vol. 30, No. 2.
Lanzoni et al., "A Novel Approach to Controlled Programming of Tunnel-Based Floating-Gate MOSFET's", 1994 IEEE Journal of Solid-State Circuits, vol. 29, No. 2, pp. 147-150.
Ohsaki, et al., "A Single Poly EEPROM Cell Structure for Use in Standard CMOS Processes", IEEE Journal of Solid-State Circuits, vol. 29, No. 3, Mar. 1994, pp. 311-316.
Raszka, J. et al., "Embedded Flash Memory for Security Applications in a 0.13 µm CMOS Logic Process", 2004 IEEE International Solid-State Circuits Conference, ISSCC, Session 2, Non-Volatile Memory, 2.4, pp. 46-47, Feb. 2004.
Shi, Y. et al., "Polarity Dependent Gate Tunneling Currents in Dual-Gate CMOSFET's", IEEE Transactions on Electron Devices, vol. 45, No. 11, Nov. 1998, pp. 2355-2360.
Usuki, T. et al., "Direct Tunneling Memory: Trade-off Between Nonvolatility and High-Endurance with Low Voltage Operations", Nonvolatile Semiconductor Workshop Symposium, Aug. 12, 2001, pp. 80-81.
Vittoz, E., "Dynamic Analog Techniques", Design of Analog-Digital VLSI Circuits for Telecommunications and Signal Processing, Second Edition, Chapter 4, 1994, pp. 97-124.
Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.
International Search Report, Application No. PCT/US03/23724, date of mailing Jan. 20, 2004.
Invitation to Pay Additional Fees, Application No. PCT/US03/31792, date of mailing Apr. 2, 2004.
International Search Report, Application No. PCT/US03/31792, date of mailing Aug. 12, 2004.
International Search Report and Written Opinion for International Application No. PCT/US2005/013644, date of mailing Aug. 3, 2005.
International Search Report, Application No. PCT/US05/010431, date of mailing Sep. 27, 2005.
International Preliminary Report on Patentability, Application No. PCT/US05/10432, date of mailing Jun. 19, 2006.
International Search Report, Application No. PCT/US05/010432, date of mailing Sep. 27, 2005.
International Search Report, Application No. PCT/US05/10434, date of mailing Sep. 13, 2005.
Invitation to Pay Additional Fees for Application No. PCT/US2005/015606, date of mailing Nov. 18, 2005.
International Search Report and Written Opinion for International Application No. PCT/US2005/015606, date of mailing Feb. 24, 2006.
Chinese First Office Action, Chinese Application No. 03820492.4, Jun. 21, 2008, 5 pages.
European Examination Report, European Application No. 03763311.2, May 18, 2005, 4 pages.
European Examination Report, European Application No. 03763311.2, Feb. 7, 2006, 3 pages.
European Examination Report, European Application No. 03763311.2, Jun. 26, 2006, 4 pages.
Partial International Search for International Application No. PCT/US03/31792, date mailed Apr. 2, 2004.
Invitation to Pay Additional Fees (Partial International Search), Application No. PCT/US 03/31792, date of mailing Apr. 22, 2004.
International Preliminary Report on Patentability for International Application No. PCT/US2005/013644, Oct. 25, 2006.
Written Opinion for International Application No. PCT/US05/10434, date of mailing Sep. 2005.
International Preliminary Report on Patentability for International Application No. PCT/US05/10434, Mar. 9, 2006.
Written Opinion for International Application No. PCT/US2005/010432, date of mailing Sep. 2005.
Written Opinion for International Application No. PCT/US2005/010431, date of mailing Sep. 2005.
International Preliminary Examination Report for International Application No. PCT/US2005/010431, Aug. 3, 2006.
Declaration of Non-Establishment of International Search Report for International Application No. PCT/US03/21239, Nov. 5, 2003, 2 pages.

International Report on Patentability for International Application No. PCT/US03/21239, May 24, 2010.
Japanese Office Action, Japanese Application No. 2004-519985, Sep. 8, 2008, 9 pages.
Taiwan Office Action, Taiwan Application No. 092118353, Jul. 30, 2008, 6 pages.
United States Office Action, U.S. Appl. No. 10/936,283, Nov. 8, 2006, 20 pages.
United States Office Action, U.S. Appl. No. 10/936,283, May 3, 2007, 18 pages.
United States Office Action, U.S. Appl. No. 11/731,228, Jul. 14, 2008, 7 pages.
United States Office Action, U.S. Appl. No. 11/731,228, Dec. 11, 2008, 8 pages.
United States Office Action, U.S. Appl. No. 10/813,907, Dec. 21, 2005, 12 pages.
United States Office Action, U.S. Appl. No. 10/813,907, Aug. 22, 2006, 8 pages.
United States Office Action, U.S. Appl. No. 10/813,907, Nov. 15, 2006, 3 pages.
United States Office Action, U.S. Appl. No. 10/814,866, Feb. 3, 2006, 26 pages.
United States Office Action, U.S. Appl. No. 10/814,866, Sep. 20, 2006, 19 pages.
United States Office Action, U.S. Appl. No. 10/814,866, Mar. 5, 2007, 19 pages.
United States Office Action, U.S. Appl. No. 10/814,866, Jul. 16, 2007, 18 pages.
United States Office Action, U.S. Appl. No. 10/814,866, Dec. 26, 2007, 12 pages.
United States Office Action, U.S. Appl. No. 10/814,868, May 3, 2006, 8 pages.
United States Office Action, U.S. Appl. No. 11/016,546, Mar. 12, 2007, 15 pages.
United States Office Action, U.S. Appl. No. 11/016,546, Aug. 6, 2007, 14 pages.
United States Office Action, U.S. Appl. No. 11/015,293, Apr. 4, 2007.
United States Office Action, U.S. Appl. No. 11/237,012, Jun. 28, 2007, 20 pages.
United States Office Action, U.S. Appl. No. 11/865,777, Jun. 24, 2009, 9 pages.
United States Office Action, U.S. Appl. No. 11/865,777, Jan. 14, 2010, 9 pages.
United States Office Action, U.S. Appl. No. 11/865,777, Aug. 3, 2010, 9 pages.
United States Office Action, U.S. Appl. No. 11/865,777, Mar. 31, 2011, 11 pages.
United States Office Action, U.S. Appl. No. 10/190,337, Jun. 17, 2003, 8 pages.
United States Office Action, U.S. Appl. No. 10/437,262, Jan. 11, 2005, 8 pages.
United States Office Action, U.S. Appl. No. 10/839,985, Nov. 29, 2005, 13 pages.
United States Office Action, U.S. Appl. No. 10/839,985, Aug. 25, 2006, 8 pages.
United States Office Action, U.S. Appl. No. 11/237,099, Oct. 2, 2006, 14 pages.
United States Office Action, U.S. Appl. No. 11/237,099, Mar. 9, 2007, 15 pages.

* cited by examiner

Hysteresis by Addition

Hysteresis by Subtraction

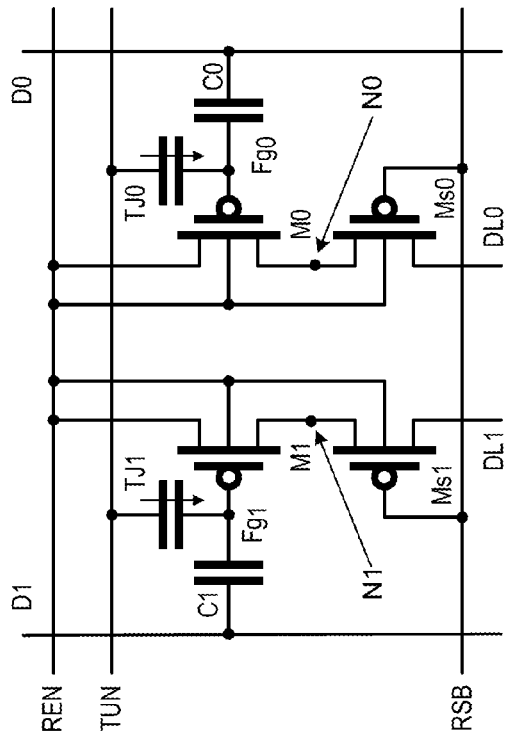
FIG. 13B
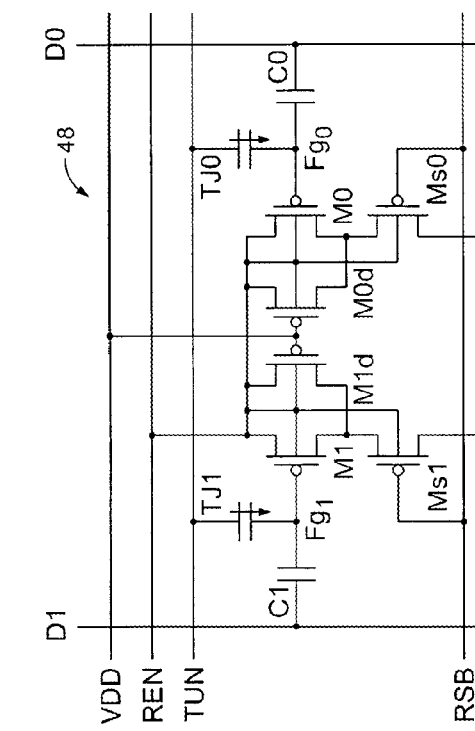
FIG. 13A (PRIOR ART)
| STATE | TUN | REN | RSB | D1 | D0 | FG1 | FG0 |
|---|---|---|---|---|---|---|---|
| READ0 | 0 | VDD | 0 | 0 | 0 | 1 | -1 |
| READ1 | 0 | VDD | 0 | 0 | 0 | -1 | 1 |
| READ IGNORE | 0 | VDD | VDD | 0 | 0 | X | X |
| WRITE0 | 10 | 0 | 5 | 0 | 10 | 1 | -1 |
| WRITE1 | 10 | 0 | 5 | 10 | 0 | -1 | 1 |
| WRITE IGNORE | 5 | 5 | 5 | X | X | N.C. | N.C. |
FIG. 14B
| STATE | TUN | REN | RSB | D1 | D0 | FG1 | FG0 |
|---|---|---|---|---|---|---|---|
| READ0 | 0 | VDD | 0 | 0 | 0 | 1 | -1 |
| READ1 | 0 | VDD | 0 | 0 | 0 | -1 | 1 |
| READ IGNORE | 0 | VDD | VDD | 0 | 0 | X | X |
| WRITE0 | 10 | 0 | 5 | 0 | 10 | 1 | -1 |
| WRITE1 | 10 | 0 | 5 | 10 | 0 | -1 | 1 |
| WRITE IGNORE | 5 | 5 | 5 | X | X | No Change | |
FIG. 14A (PRIOR ART)

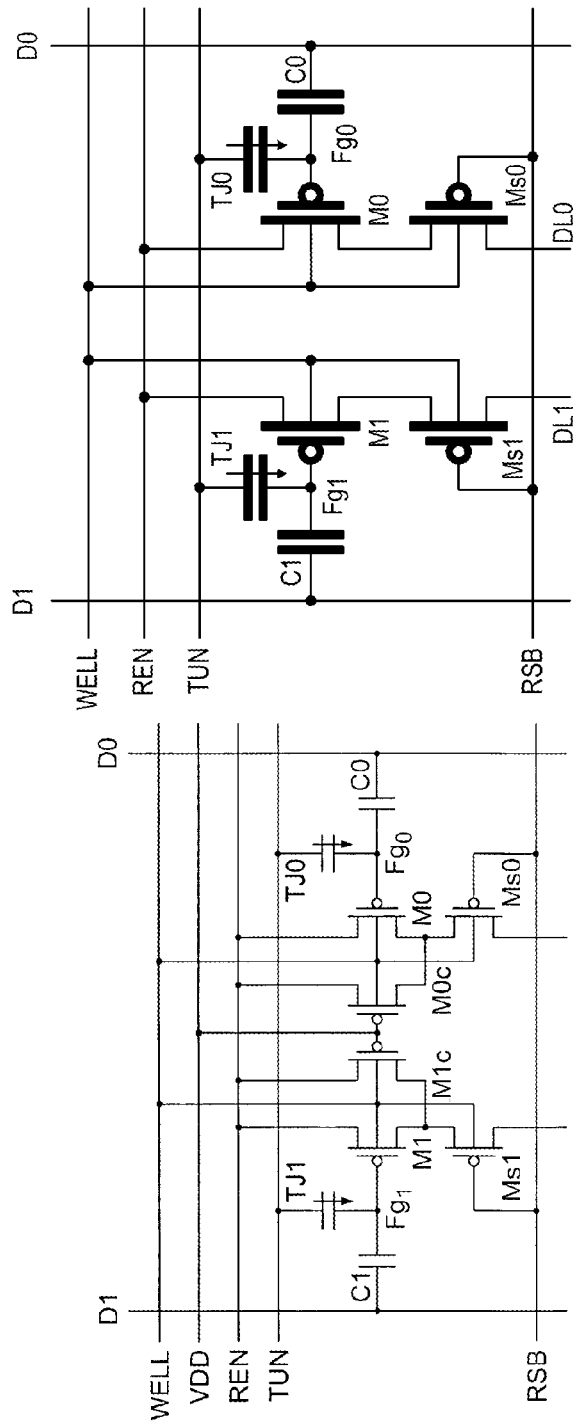

US 8,111,558 B2

PFET NONVOLATILE MEMORY

RELATED APPLICATIONS

This application is a Continuation-In-Part (CIP) of U.S. patent application Ser. No. 11/237,099, filed Sep. 28, 2005 now U.S. Pat. No. 7,283,390 titled "HYBRID NON-VOLATILE MEMORY", by inventor Alberto Pesavento, issued Oct. 16, 2007, which is a CIP of U.S. patent application Ser. No. 10/839,985, filed May 5, 2004, now U.S. Pat. No. 7,221,596, issued on May 22, 2007.

TECHNICAL FIELD

The present invention relates generally to nonvolatile memory. More particularly, the present invention relates to single-ended and differential-type nonvolatile memory using floating-gate p-channel field effect transistors (pFETs) to store information as electric charge.

BACKGROUND

Nonvolatile memory (NVM) is an important form of memory in today's electronic circuits. NVM is used to store serial number information, security information, settings, parameters, computer instructions (firmware), and the like. Reprogrammable NVM is particularly important in the field of tags, such as RFID (radio frequency identification) tags, which store information inexpensively and can be remotely sensed without the need to complete an actual circuit with the RFID tag itself. Such tags lack their own power supply and are powered instead by current rectified from a scanner's read-carrier RF signal received from an RFID reader/scanner.

SUMMARY

A nonvolatile memory cell is constructed using a floating-gate pFET readout transistor having its source tied to a power source (Vdd), its drain providing the current, which can be sensed to determine the state of the cell. The gate of the pFET readout transistor provides for charge storage, which can be used to represent information such as binary bits. A control capacitor structure having its first terminal coupled to the first voltage source and its second terminal coupled to the floating gate and a tunneling capacitor structure having its first terminal coupled to the second voltage source and its second terminal coupled to the floating gate are utilized in each embodiment. The control capacitor structure may be fabricated so that it has much more capacitance than does the tunneling capacitor structure (and assorted stray capacitance between the floating gate and various other nodes of the cell). Manipulation of the voltages applied to the first voltage source and second voltage source (and Vdd) control an electric field across the capacitor structure and pFET dielectrics, thus Fowler-Nordheim tunneling of electrons onto and off of the floating gate, thus controlling the charge on the floating gate and the information value stored thereon. Both single-ended and differential memory cells are implemented. Hysteresis circuits may also be provided to supply additional write margin. Arrays of such nonvolatile memory cells are also implemented.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 13A is an electrical schematic diagram of an NVM cell, for use in an array of NVM cells, in accordance with a PRIOR ART embodiment.

FIG. 13B is an electrical schematic diagram of an NVM cell, for use in an array of NVM cells, in accordance with an embodiment of the present invention.

FIG. 14A is a table, illustrating a set of applied voltages and operating states for the NVM cell of FIG. 13A.

FIG. 14B is a table, illustrating a set of applied voltages and operating states for the NVM cell of FIG. 13B.

FIG. 17 is an electrical schematic diagram of an NVM cell, for use in an array of NVM cells, in accordance with another embodiment of the present invention.

FIG. 18 is a table illustrating a set of applied voltages and operating states for the NVM cell of FIG. 17.

DETAILED DESCRIPTION

Figure 1A:
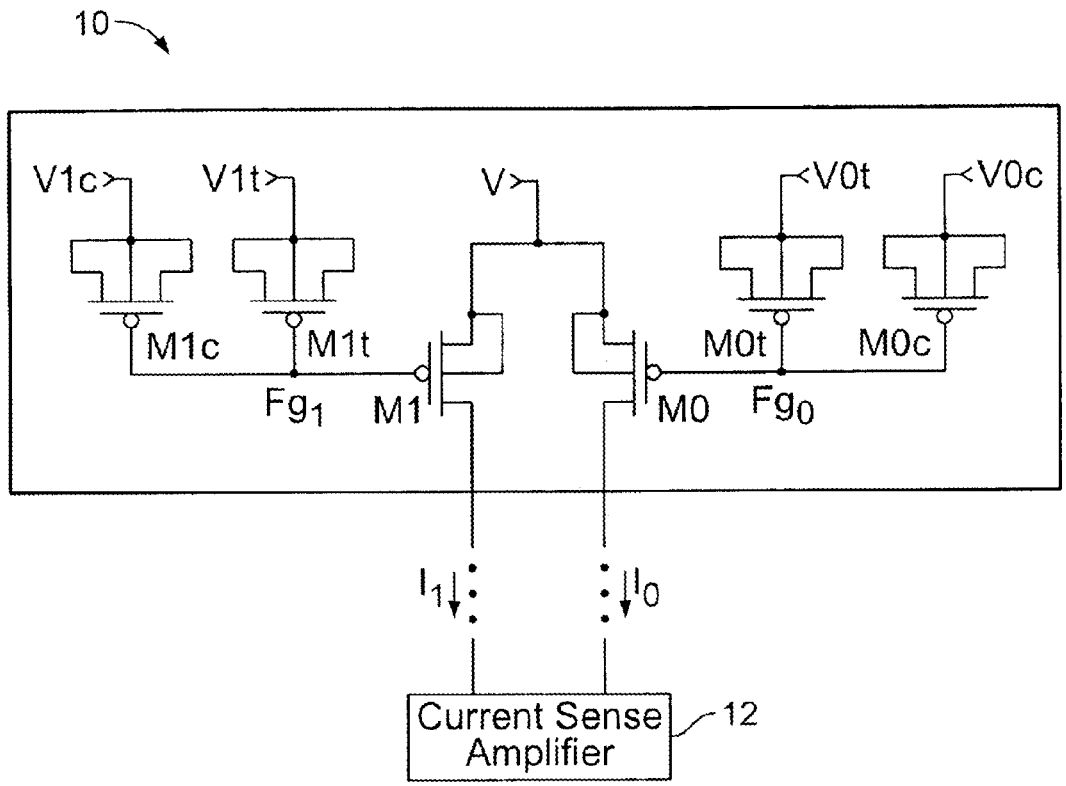
FIG. 1A is an electrical schematic diagram illustrating an embodiment of a basic differential pFET NVM memory cell 10, in accordance with an embodiment of the present invention.

Embodiments of the present invention described in the following detailed description are directed at floating-gate nonvolatile memory cells having pFET readout transistors. Those of having ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as, compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter for p− wells and a doping level on the order of $10^{15}$ atoms per cubic centimeter for p− substrate material. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates, as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

A number of circuits, that may be used as NVM cells and arrays for such cells, are described in detail below. These NVM circuits are able to store information by modifying a charge (i.e., by adding or removing electrons) stored on a floating gate of one or more pFET transistors. In digital implementations of the invention, the state (i.e., either a "1" or a "0") of the memory cell is read by measuring the current of some of the pFETs in the circuit. The use of pFETs instead of nFETs (n-channel FETs) offers better data retention, higher endurance, and requires no additional processing steps beyond what is available in standard logic CMOS processes.

Obviously, if desired, these circuits can be fabricated in as complicated a process as desired; however, they are all capable of being fabricated in single-poly (single layer of polysilicon) logic CMOS processes, as supported by virtually all semiconductor foundries operating today. Conventional FLASH and EEPROM NVM require special process steps beyond those of logic CMOS and are, consequently, more difficult and more expensive to fabricate. Applications that require up to several kilobytes of NVM on the same chip with other circuitry and/or require low cost fabrication are ideal candidates for the circuits discussed herein.

Turning now to FIG. 1A, a basic differential pFET NVM memory cell 10 is illustrated. This cell has two floating gates denoted $Fg_0$ and $Fg_1$. By storing a different amount of electrons on the two floating gates, it is possible to establish a voltage differential between the two floating gates. When the NVM cell is powered, through the terminal denoted "V", a difference in the readout currents $I_0$ and $I_1$ is present and a sense amplifier such as a conventional current sense amplifier 12 can consequently be used to discern the logic value stored in the cell. For example, the condition $I_0 > I_1$ may be used to signify the logic value "0" and the condition $I_0 < I_1$ may be used to signify the logic value "1".

As shown in FIG. 1A, transistors M1, M1t and M1c have floating gate $Fg_1$ in common. Transistors M0, M0t and M0c have floating gate $Fg_0$ in common. V1c is the voltage terminal for transistor M1c; V1t is the voltage terminal for transistor M1t; V is the voltage terminal for transistors M1 and M0; V0t is the voltage terminal for transistor M0t; and V0c is the voltage terminal for transistor M0c. As can be seen M1c, M1t, M0t, and M0c, in accordance with this illustrated embodiment, may all be shorted pFETs in that their source, drain and well connections are all tied together as shown. The voltage terminals referred to above are therefore connected to the respective source, drain and well of the shorted pFETs. M1c, M1t, M0t, and M0c may also be constructed as other types of transistors, such as nFETs. M1c and M0c, which are used as control capacitors, may also be constructed as poly-poly, or poly-metal capacitors. Metal-metal capacitors can also be used for the control capacitor structures, although with existing fabrication processes this would reduce the memory retention time due to leakage from the poly contact and the metal inter-layer dielectric. By applying the appropriate voltages to terminals V01, V0t, V1c, V1t and V, a sufficiently large electric field can be established across the oxide dielectric of any of the three pFETs connected to each floating gate $Fg_0$, $Fg_1$, so that the well-known mechanism of Fowler-Nordheim (FN) tunneling may be used to pass electrons through the oxide dielectric of the selected transistor.

Figure 1B:
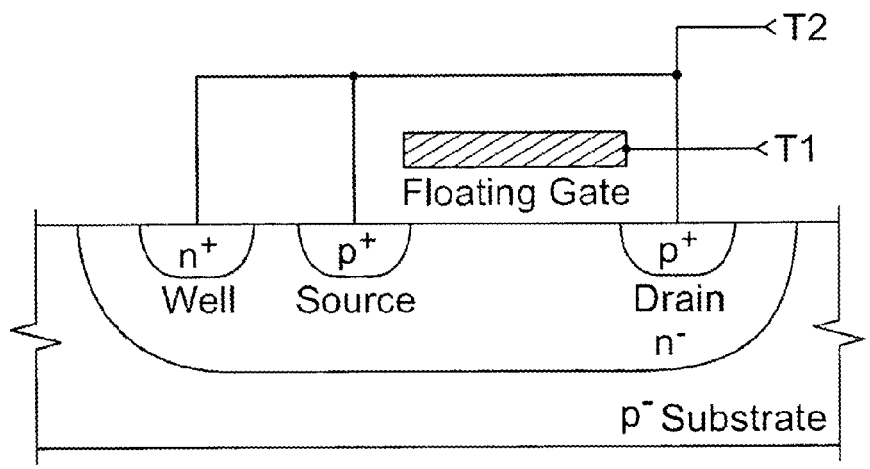
FIG. 1B is a side elevational diagram of a well-source-drain shorted pFET as used in some embodiments of the present invention for the control capacitor structure and the tunneling transistor structure.
Figure 1C:
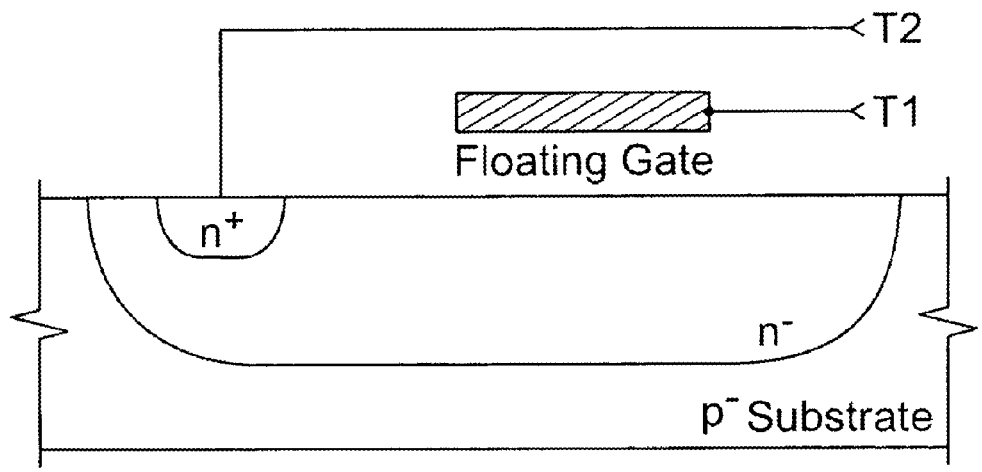
FIG. 1C is a side elevational diagram of a simplified capacitor structure as used in some embodiments of the present invention for the control capacitor structure.

In order to establish a large electric field across one of the pFETs' oxides, the gate area of one of the two corresponding shorted pFETs (e.g., M1c and M1t shown on the left side in FIG. 1A) should be made sufficiently large so that it acts as a control capacitor for the floating gate itself. FIG. 1B is a side elevational diagram of a well-source-drain shorted pFET as used in some embodiments of the present invention for the control capacitor structure and the tunneling transistor structure. Terminals T1 and T2 are the capacitor terminals. FIG. 1C is a side elevational diagram of a simplified capacitor structure as used in some embodiments of the present invention for the control capacitor structure. Terminals T1 and T2 are the capacitor terminals although the device of FIG. 1C is not, strictly speaking, a transistor. Those of ordinary skill in the art will now realize that various other structures may be used to achieve the same purposes.

Figure 2:
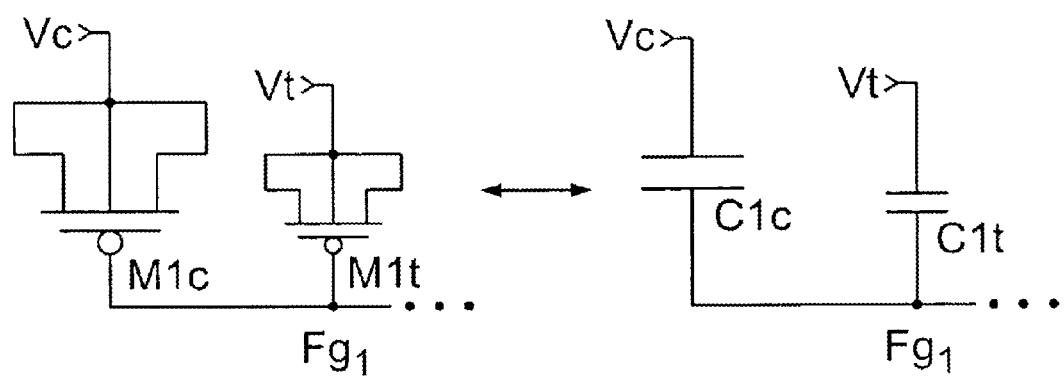
FIG. 2 is a partial electrical schematic diagram, illustrating on the left, a portion of the schematic of FIG. 1A with the control transistor (also referred to herein as a control capacitor or control capacitor structure) M1c, shown enlarged relative to tunneling transistor (also referred to herein as a tunneling transistor or tunneling transistor structure) M1t. On the right of the schematic diagram symbol for a capacitor C1c takes the place of transistor M1c and the schematic diagram symbol for a capacitor C1t takes the place of transistor M1t.

Turning now to FIG. 2, on the left is a portion of the schematic of FIG. 1A with the transistor M1c shown enlarged relative to transistor M1t; on the right capacitor C1c takes the place of transistor M1c and capacitor C1t takes the place of transistor M1t. Where the physical size of transistor M1c is much larger than that of transistor M1t then M1c behaves like a control capacitor for the floating gate Fg1 and can be used to control the floating-gate voltage to establish a large electric field that can be applied to induce bidirectional FN tunneling.

Figure 3:
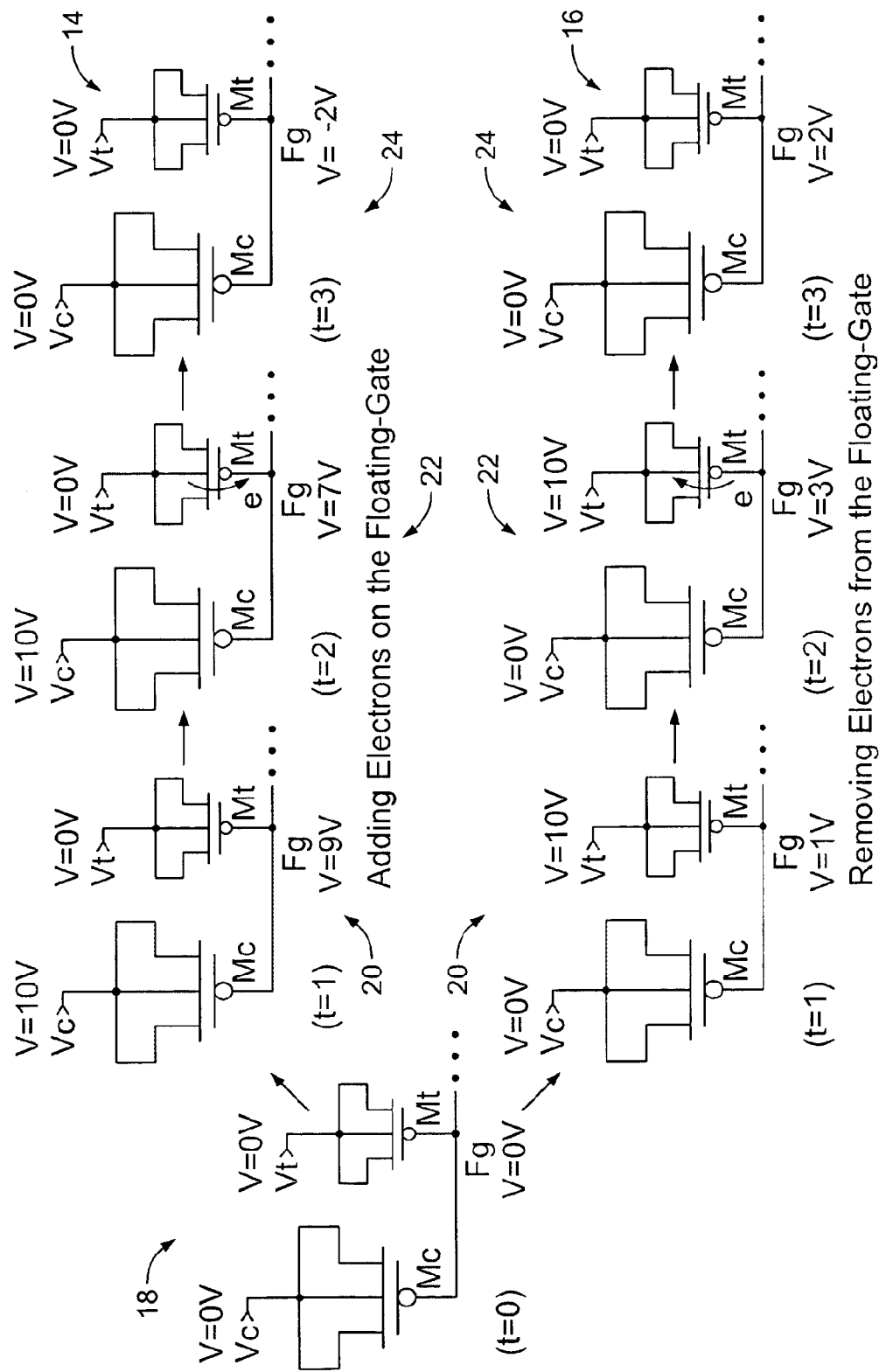
FIG. 3 is a process flow diagram formed of partial electrical schematic diagrams, like those in FIG. 2 which illustrates the process for adding and removing electrons from a floating gate Fg, in accordance with an embodiment of the present invention.

Turning now to FIG. 3, the process for adding and removing electrons from a floating gate Fg is illustrated. The upper branch of the process is denoted 14, and illustrates adding electrons to the floating gate to drop its voltage from 0V to −2V. The lower branch of the process is denoted 16, and illustrates removing electrons from the floating gate to raise its voltage from 0V to +2V.

In more detail, starting from the rest condition 18 with Vc=0V (Vc here is the voltage applied to the source, drain and well terminals of control transistor Mc), Vt=0V (likewise, Vt here is the voltage applied to the source, drain and well terminals of tunneling transistor Mt) and Fg=0V at time t=0, one first establishes the appropriate voltage across the oxide of one of the pFETs by changing the voltage of either Vc or Vt. Due to the skewed capacitive ratio between the two pFETs Mc and Mt, the floating gate is more strongly coupled to the control voltage Vc, creating a large electric field through the oxide of the tunneling pFET Mt at time t=1 (20). Once the electric field is present, electrons start tunneling through the oxide of Mt either adding or removing charge from the floating gate at time t=2 (22). After a certain amount of time the voltage of the floating gate has changed enough to decrease the electric field to the point that the tunneling process is slowed considerably. If the rest biases (Vc=Vt=0V) are then reapplied at time t=3 (24), the net effect of the procedure is that the charge on the floating gate was modified. The voltage values in the example of FIG. 3 are intended to be just an example. The real values will depend upon various factors such as oxide thickness and quality, desired program time, endurance and retention requirements, and the fabrication process used and are well within the skills of those of ordinary skill in the art having the benefit of this disclosure.

Figure 4:
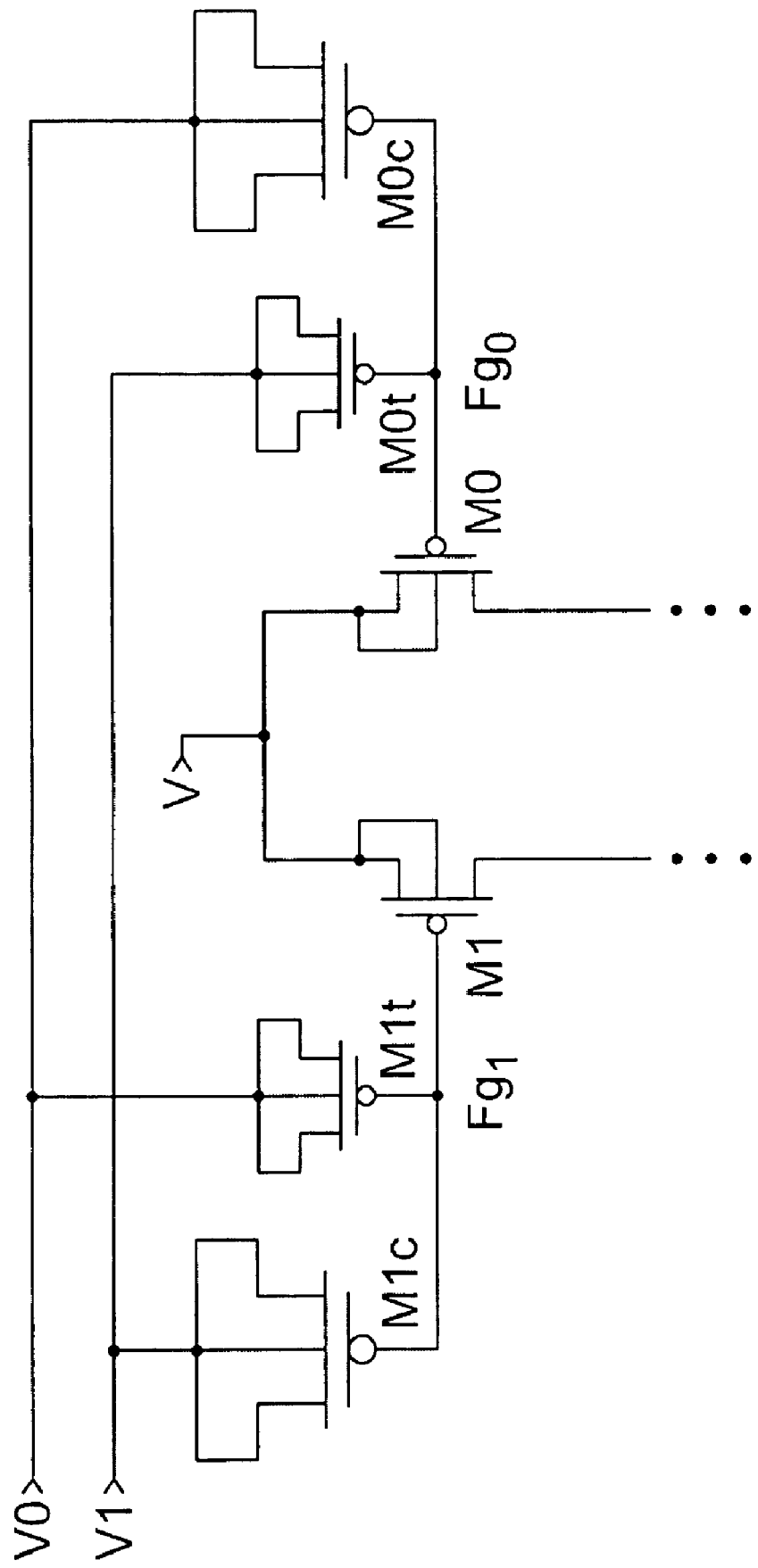
FIG. 4 is an electrical schematic diagram of an NVM cell, in accordance with an embodiment of the present invention, in which the V0 signal is coupled to the tunneling transistor M1t for floating gate $Fg_1$ and to the control transistor M0c for floating gate $Fg_0$, while the V1 signal is coupled to the control transistor M1c for floating gate $Fg_1$ and to the tunneling transistor M0t for floating gate $Fg_0$.

It is now easy to observe that if the opposite biasing voltages are applied to the "0" and "1" sides of the differential NVM cell, electrons can be removed from one floating gate while they are being added to the other. This can be easily accomplished by connecting the NVM cell as illustrated in FIG. 4. In this embodiment, the V0 signal is coupled to the tunneling transistor M1t for floating gate $Fg_1$ and to the control transistor M0c for floating gate $Fg_0$ while the V1 signal is coupled to the control transistor M1c for floating gate $Fg_1$ and to the tunneling transistor M0t for floating gate $Fg_0$.

Figure 5:
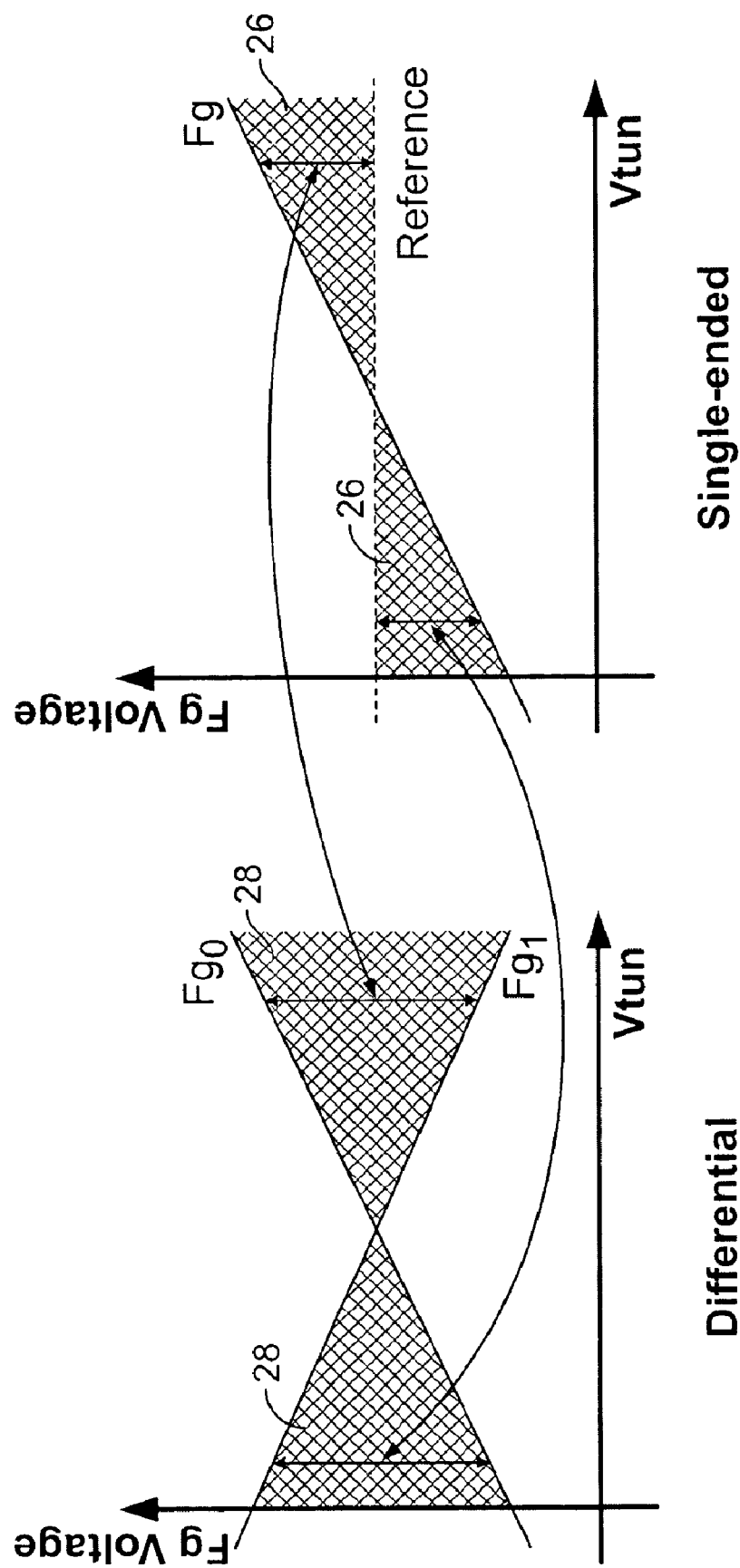
FIG. 5 is a plot of Vtun (tunneling voltage) vs. floating gate voltage for the differential and single-ended cases of NVM cells.

The use of a differential memory cell is advantageous because it allows the doubling of the storage window with respect to a single-ended memory cell. This is illustrated in FIG. 5, which shows a plot of Vtun (tunneling voltage) vs. floating gate voltage for the differential and single-ended cases. In a single-ended cell, a reference voltage is generally required and a viable result may be obtained in the sectors shown as shaded and denoted 26. In the double-ended cell, no reference voltage is required and a viable result may be obtained in much larger sectors shown as shaded and denoted 28.

A single-ended approach, on the other hand, has the benefit of reducing by approximately half the number of transistors in the memory cell thus providing an advantage with respect to the differential version in terms of area and cost. The memory cell of FIG. 1A, and the other versions thereof shown and described herein, can be easily implemented as single-ended cells in accordance with the teachings herein with particular reference to FIGS. 6A, 6B and 6C. Differential memory is particularly advantageous in situations where reliable reference voltage sources are not readily available, such as, in portable devices, remotely powered devices (such as RFID tags and security cards), and the like.

Figure 6A:
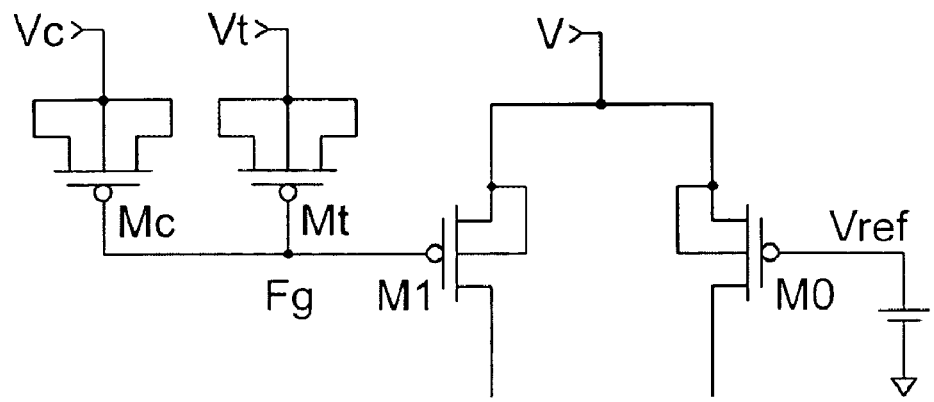
FIGS. 6A, 6B, and 6C illustrate various ways to implement the present invention in a single-ended circuit. In accordance with the circuit of FIG. 6A the second floating gate is coupled to a voltage source to provide a voltage reference for the pFET M0. A practical reference can be ground itself, as illustrated in FIG. 6B. The pFET M0 can be omitted altogether, as in FIG. 6C, if a current reference (not shown) is available to the sense amplifier for the current comparison.
Figure 6B:
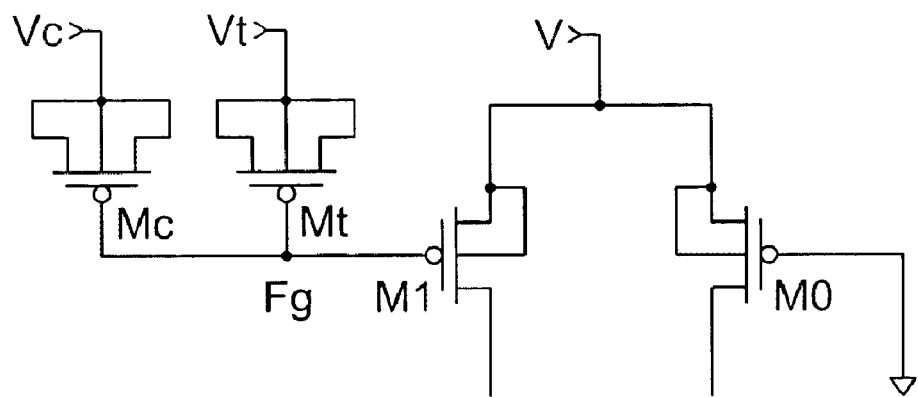
Figure 6C:
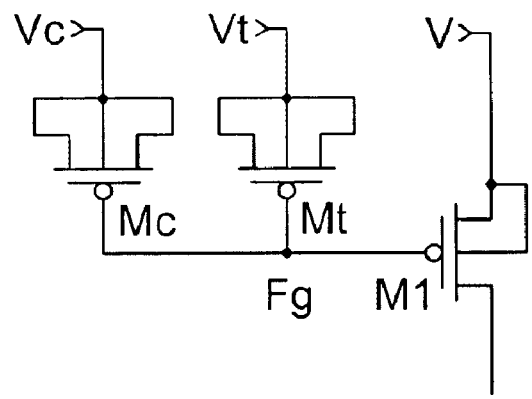

FIGS. 6A, 6B and 6C illustrate various ways to implement the present invention in a single-ended circuit. In accordance with the circuit of FIG. 6A the second floating gate is coupled to a voltage source to provide a voltage reference for the pFET M0. A practical reference can be ground itself, as illustrated in FIG. 6B. The pFET M0 can be omitted altogether, as in FIG. 6C, if a current reference (not shown) is available to the sense amplifier for the current comparison.

In accordance with the embodiments of FIGS. 6A, 6B and 6C, to program a logic "0" in a cell that has a stored logic "1" it is necessary to apply the correct voltages to the terminals V0 and V1 (see, e.g., FIG. 4). Using the convention that there is a logic "0" when I0>I1 the correct voltages are V0=10V and V1=0V (note that, if desired, the convention could be reversed).

For technical reasons (to avoid overstressing the oxide with excess tunneling current) and practical reasons (limitation of the charge pump supplying the high-voltage) the high-voltage applied to program the cell is not held constant but rather is applied with a ramp-like profile. It is possible to perform a timed program operation where the high-voltage is applied for a certain amount of time that is deemed sufficient to tunnel the right amount of charge to and from the floating gates. This can be problematic where transistors are not precisely identical throughout an array or chip as size or conductivity differences may lead one cell to require a longer amount of time to achieve the same state as another cell. Another approach involves applying the high-voltage until a read operation on the memory cell reports that the desired logic value is stored in the cell. This does not pose any technical problems because the time it takes to read the cells is much less than the time it takes to write them. To insure a sufficient write margin a hysteresis mechanism can be introduced to make sure the desired programming window is achieved. Hysteresis can be achieved either by subtracting some current from the winning side (the side that is increasing its intrinsic current, also known as the high current side) or by adding some current to the losing side (the side that is decreasing its intrinsic current, also known as the low current side). This concept is illustrated in FIGS. 7A, 7B, and 7C.

Figure 7A:
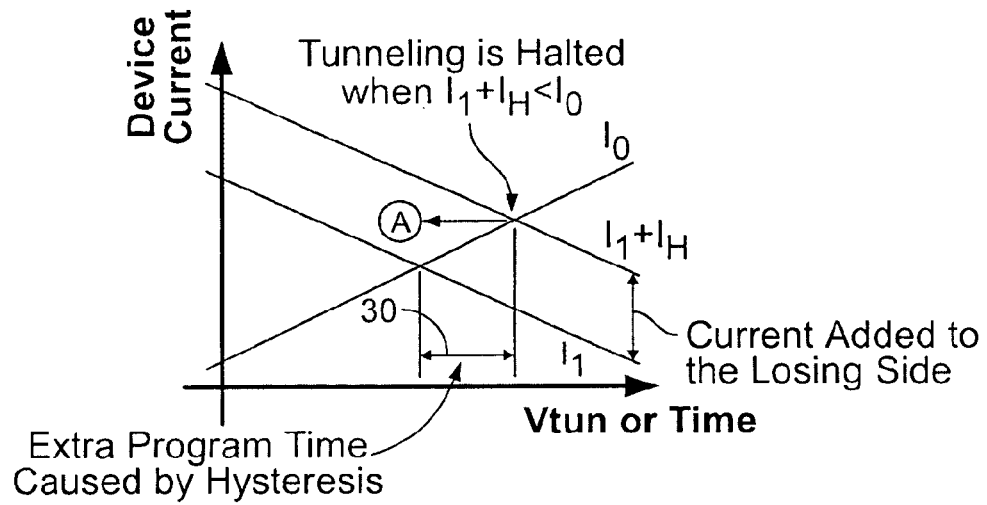
FIG. 7A is a plot of Device readout current vs. Vtun (or, effectively, time) illustrating the concept of hysteresis by addition, in accordance with an embodiment of the present invention. The $I_0/I_1$ curves are the nominal curves. The $I_1+I_H$ curve represents the $I_1$ curve to which hysteresis current $I_H$ has been added. Tunneling is halted when $I_1+I_H<I_0$.
Figure 7B:
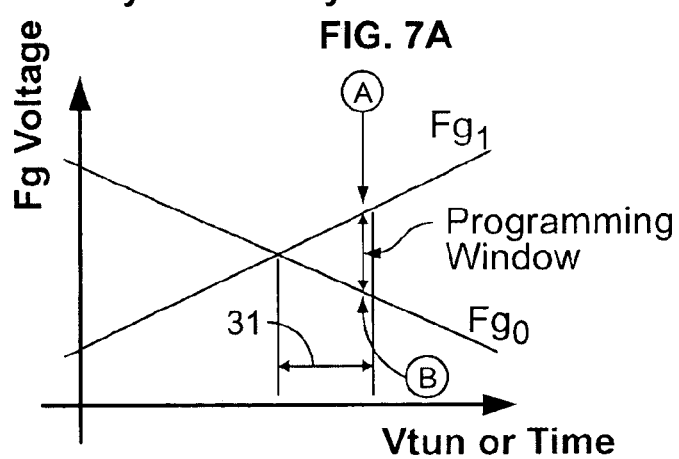
FIG. 7B is a plot of Fg Voltage vs Vtun (or time) for $Fg_0$ and $Fg_1$ illustrating the increase in the size of the programming window as a result of adding the hysteresis current $I_H$.
Figure 7C:
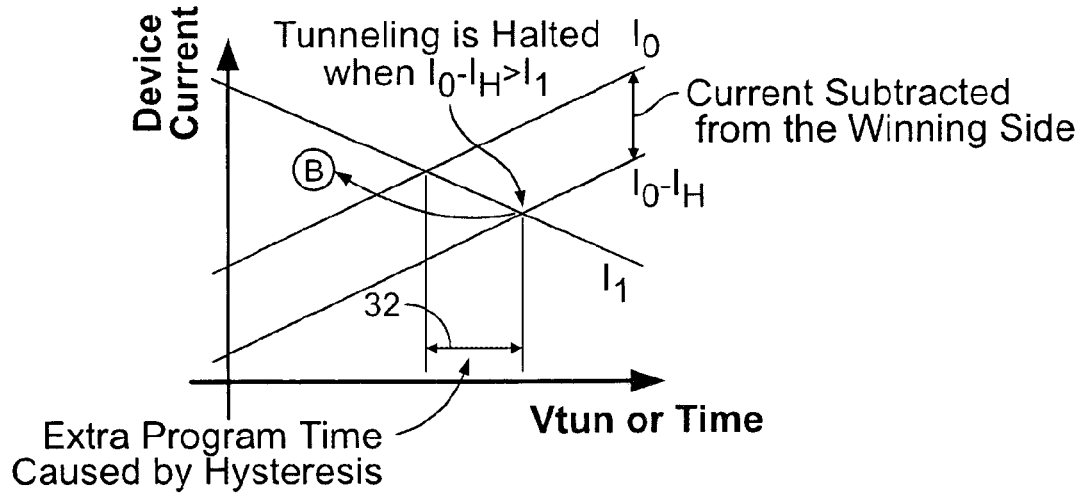
FIG. 7C is a plot of Device current vs. Vtun (or time), illustrating the concept of hysteresis by subtraction. in accordance with an embodiment of the present invention.

FIG. 7A is a plot of Device readout current vs. Vtun (or, effectively, time) and illustrating the concept of hysteresis by addition. The $I_0/I_1$ curves are the nominal curves. The $I_1+I_H$ curve represents the $I_1$ curve to which has been added hysteresis current $I_H$. Tunneling is thus halted when $I_1+I_H<I_0$. FIG. 7B is a plot of Fg Voltage vs Vtun (or time) for $Fg_0$ and $Fg_1$ illustrating the increase in the size of the programming window as a result of adding the hysteresis current $I_H$. FIG. 7C is a plot of Device current vs. Vtun (or time) and illustrating the concept of hysteresis by subtraction. The $I_0/I_1$ curves are the nominal curves. The $I_0-I_H$ curve represents the $I_0$ curve from which has been subtracted hysteresis current $I_H$. Tunneling is thus halted when $I_0-I_H>I_1$. Extra program time to achieve the additional margin is incurred by the hysteresis—shown as 30 in FIG. 7A, 31 in FIG. 7B, and 32 in FIG. 7C.

Figure 8:
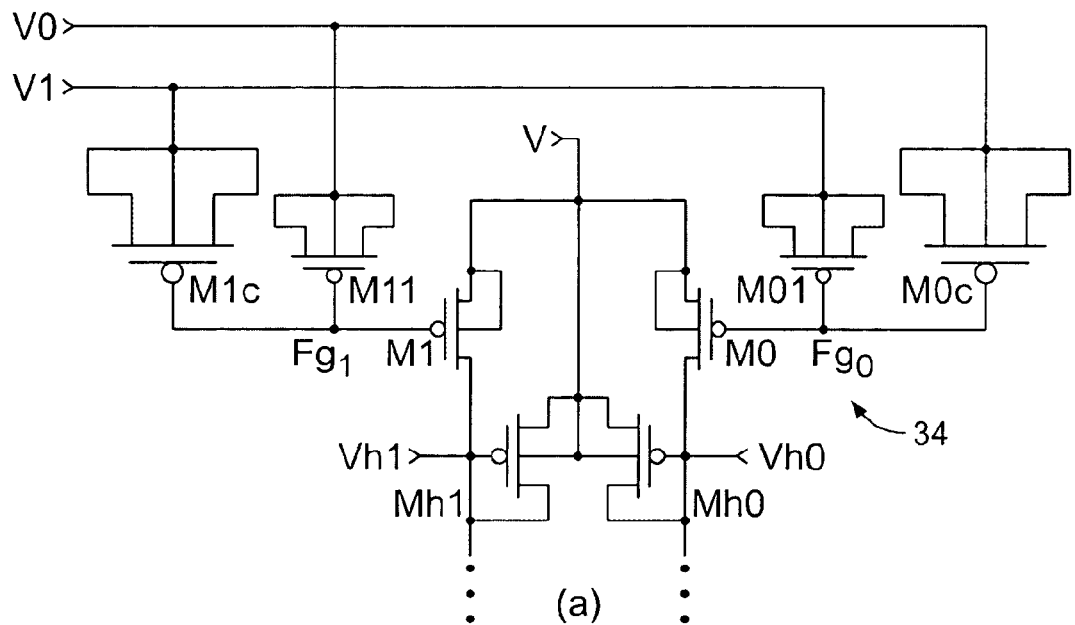
FIG. 8 is an electrical schematic diagram of an NVM cell 34 in accordance with an embodiment of the present invention. The NVM cell 34 utilizes hysteresis by addition and has added pFET transistors Mh1 and Mh0, which have their source and well terminals coupled to V and their drains coupled to the respective current output legs (drains) of the M1 and M0 readout transistors. In this way, the current from Mh1 is added to transistor M1's output current and the current from Mh0 is added to transistor M0's output current. The control signals Vh1 and Vh0 applied, respectively, to the gates of Mh1 and Mh0 control the hysteresis during programming.
Figure 9:
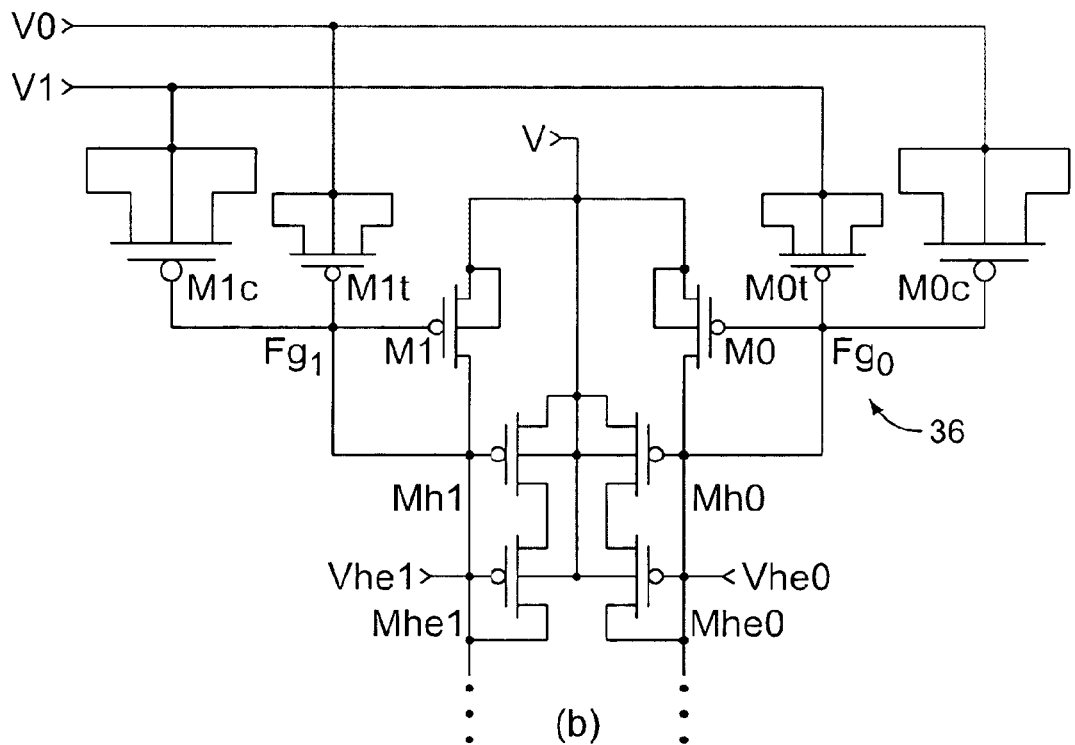
FIG. 9 is an electrical schematic diagram of an NVM cell 36, in accordance with an embodiment of the present invention. The NVM cell 36 utilizes hysteresis by addition and has added pFET transistors Mh1, Mhe1, Mh0 and Mhe0. Mh1 and Mh0 have their source and well terminals coupled to V and Mhe1 and Mhe0 have their well terminals coupled to V and their sources coupled to the drains of Mh1 and Mh0, respectively. The drains of Mhe1 and Mhe0 provide the additional hysteresis current during programming. Operation of transistors Mhe1 and Mhe0 is controlled by signals Vhe1 and Vhe0, respectively, applied to their gates.
Figure 10:
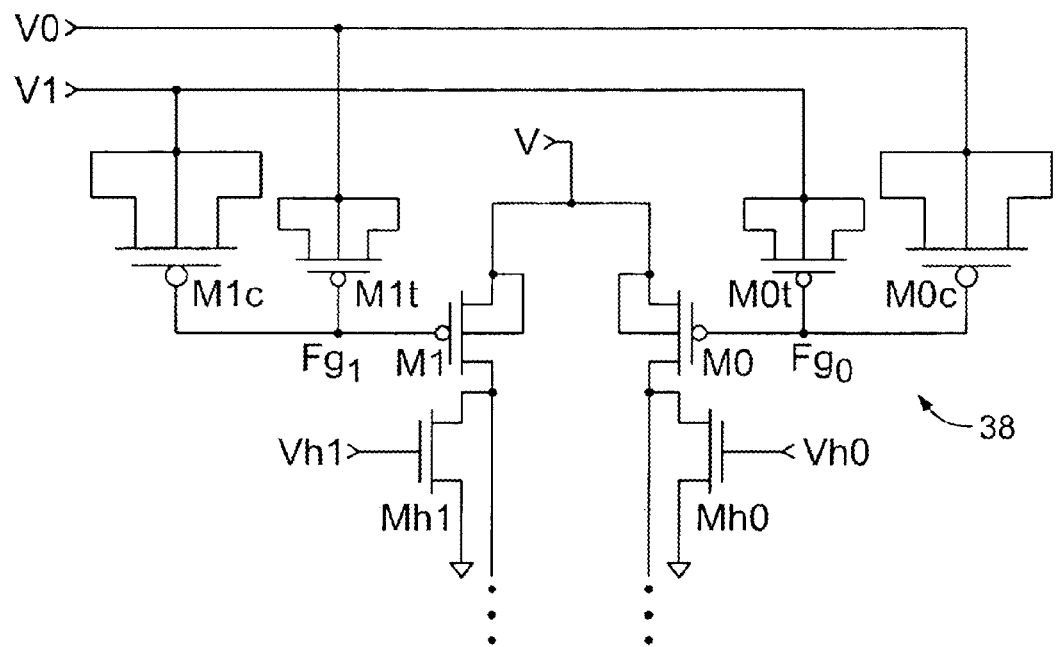
FIG. 10 is an electrical schematic diagram of an NVM cell 38, in accordance with an embodiment of the present invention. The NVM cell 38 utilizes hysteresis by subtraction and has added nFET transistors Mh1 and Mh0 coupled so that their sources are coupled to ground and their drains are in common, respectively, with the drains of M1 and M0, thus subtracting current when they are engaged. Control signals Vh1 and Vh0 applied, respectively, to the gates of Mh1 and Mh0 control the hysteresis function.

In order to implement the hysteresis during programming the basic NVM cell may be modified to include transistors necessary to perform the function. Some examples of such modifications of the basic memory cell are depicted in FIGS. 8, 9 and 10. The FIG. 8 (hysteresis by addition) NVM cell 34 has added pFET transistors Mh1 and Mh0, which have their source and well terminals coupled to V and their drains coupled to the respective current output legs (drains) of the M1 and M0 readout transistors. In this way, the current from Mh1 is added to transistor M1's output current and the current from Mh0 is added to transistor M0's output current. The control signals Vh1 and Vh0 applied, respectively, to the gates of Mh1 and Mh0 control the hysteresis during programming.

The FIG. 9 (hysteresis by addition) NVM cell 36 has added pFET transistors Mh1, Mhe1, Mh0 and Mhe0. Mh1 and Mh0 have their source and well terminals coupled to V and Mhe1 and Mhe0 have their well terminals coupled to V and their sources coupled to the drains of Mh1 and Mh0, respectively. The drains of Mhe1 and Mhe0 provide the additional hysteresis current during programming. Operation of transistors Mhe1 and Mhe0 is controlled by signals Vhe1 and Vhe0, respectively, applied to their gates. Transistors Mh1 and Mh0 in this application have their gates coupled, respectively, to floating gates $Fg_1$ and $Fg_0$ which has the effect of making the hysteresis current proportional to the current of the readout transistor. This approach allows the combined current of the hysteresis transistor and the readout transistor to go to zero and thus guarantees that cell programming can complete. With a fixed hysteresis current, cell programming may not complete if the hysteresis current exceeds the maximum available current from the readout transistor.

The FIG. 10 (hysteresis by subtraction) NVM cell 38 has added nFET transistors Mh1 and Mh0 coupled so that their sources are coupled to ground and their drains are in common, respectively, with the drains of M1 and M0, thus subtracting current when they are engaged. Control signals Vh1 and Vh0 applied, respectively, to the gates of Mh1 and Mh0 control the hysteresis function.

Figure 11A:
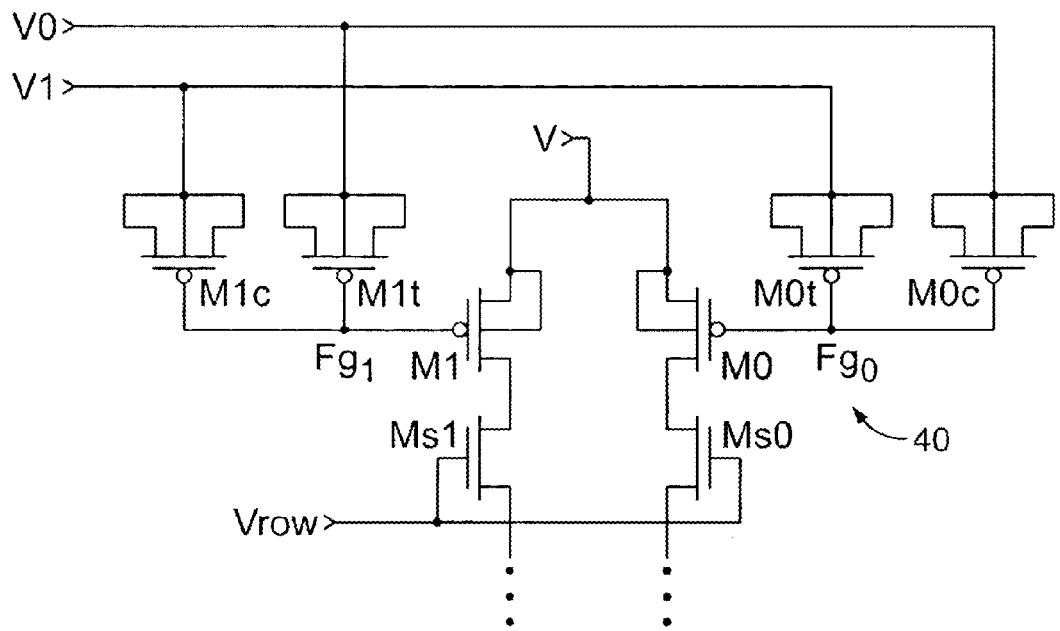
FIG. 11A is an electrical schematic diagram of an NVM cell 40, in accordance with an embodiment of the present invention. The NVM cell 40 includes a pair of nFET readout transistors Ms1 and Ms0 configured as row-select transistors, which control current flow in the drain legs of readout transistors M1 and M0, respectively.
Figure 11B:
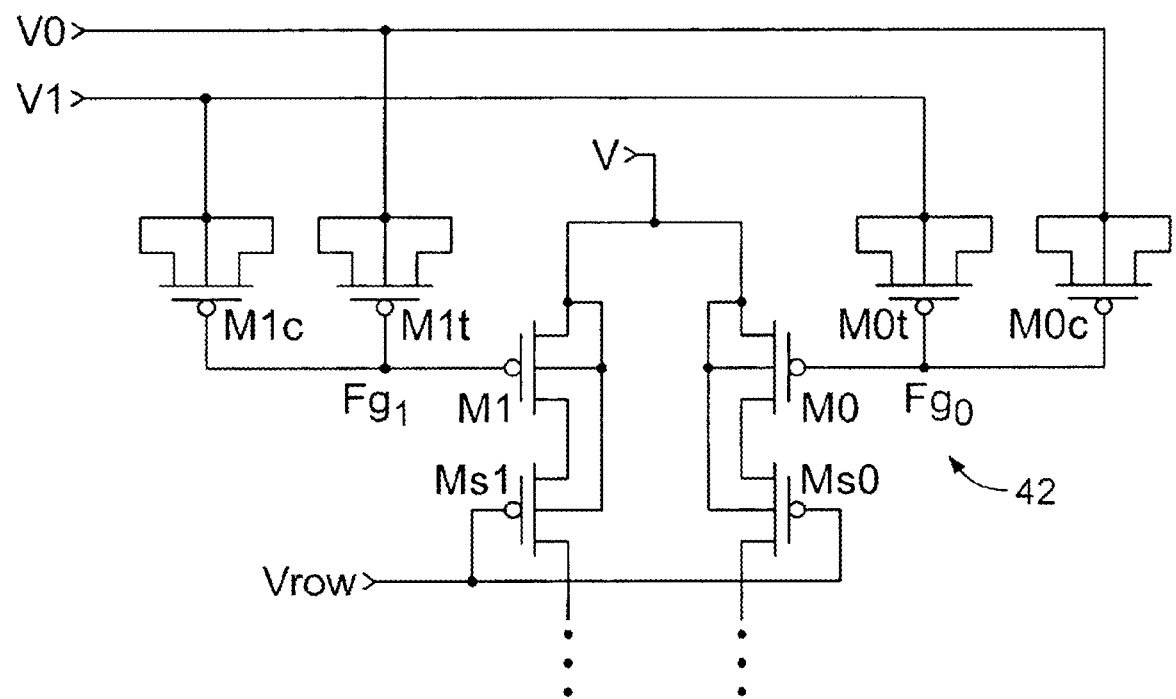
FIG. 11B is an electrical schematic diagram of an NVM cell 42, in accordance with an embodiment of the present invention. The NVM cell 42 includes a pair of pFET readout transistors Ms1 and Ms0 configured as row-select transistors, which control current flow in the drain legs of readout transistors M1 and M0, respectively.

In order to provide an array-type memory disposed in columns and rows as is common in semiconductor memories, it may be desirable to provide readout transistors to control which cells are being read out at a given moment. In NMV circuit 40 of FIG. 11A a pair of nFET readout transistors Ms1 and Ms0 configured as row-select transistors control current flow in the drain legs of readout transistors M1 and M0, respectively. The Vrow signal is coupled to the gates of Ms1 and Ms0 to control whether they conduct or not. Similarly, in NVM circuit 42 of FIG. 11B a pair of pFET readout transistors Ms1 and Ms0 control current flow in the drain legs of readout transistors M1 and M0, respectively. The Vrow signal is coupled to the gates of Ms1 and Ms0 to control whether they conduct or not. These may be used with, or without, the hysteresis transistors discussed above, as desired. Hysteresis current may be added before or after the row select transistors. Hysteresis current added after the row select transistors may be common to all the memory cells in the column. This reduces the total number of devices required and thus reduces memory area.

Figure 12:
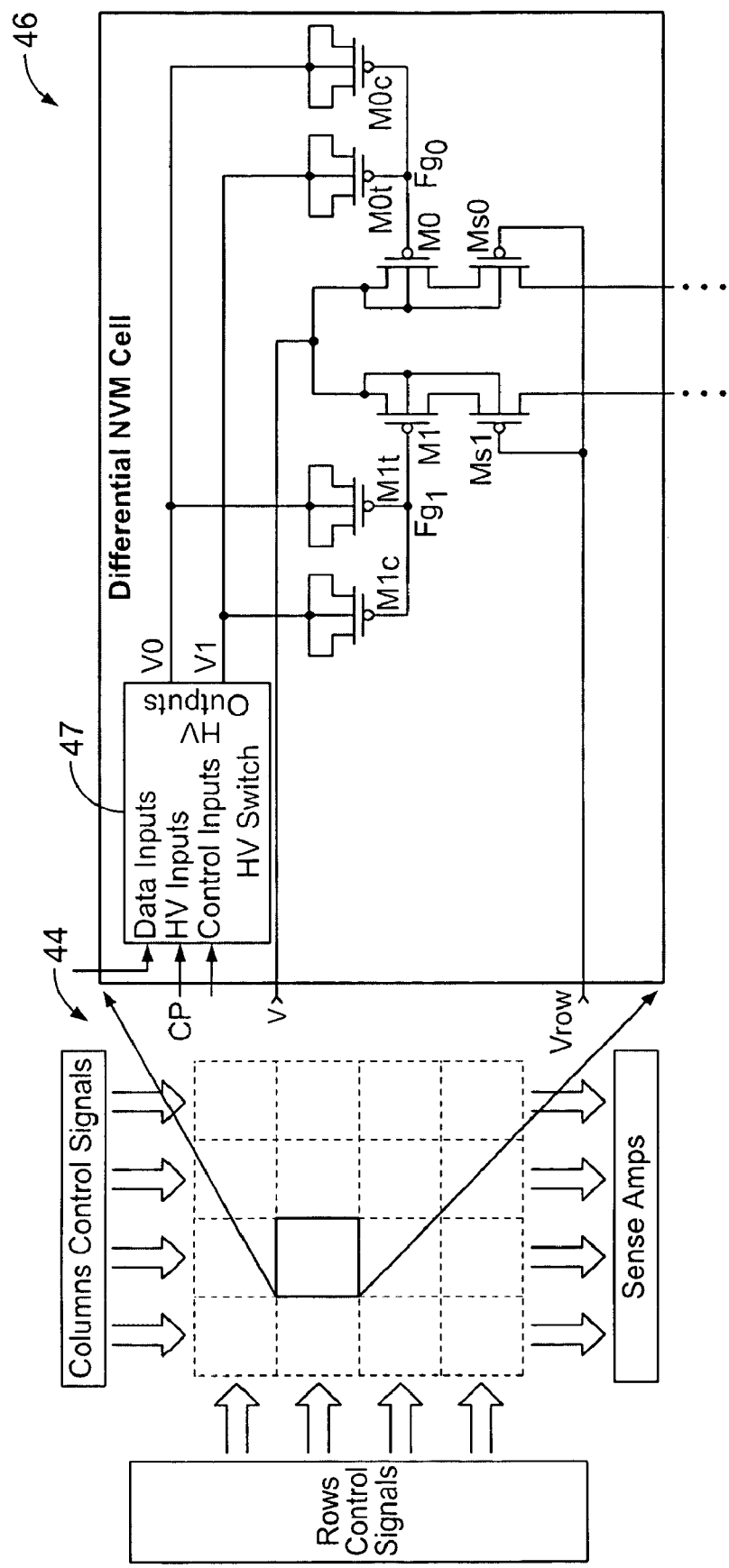
FIG. 12 is a block diagram of an array of NVM cells and an electrical schematic diagram of one of those cells, in accordance with an embodiment of the present invention.

Once the row-select transistors are embedded in the nonvolatile memory cells, it is possible to array the cells in a row-column configuration like the one depicted in FIG. 12. A drawback of this approach is that every nonvolatile memory cell will be required to contain a high-voltage switch (typically a high-voltage nFET with its drain disposed in an n+ region such as an LDMOS (lateral defused MOS) or a DEMOS (drain extended MOS) cascoded with another nFET so that it can handle the relatively high voltages used for writing the NVM cells without breaking down) to provide the appropriate data-dependent voltages to the V0 and V1 terminals of the memory cell during programming.

In the array 44 of NVM cells 46 depicted in FIG. 12, column control signals comprise the data inputs referred to as D1 and D0 for the cell; row control signals comprise the row select signals and any hysteresis control signals which may be used as well as the high-voltage power for the high-voltage switch for each NVM cell. Other control signals may be also used, depending on the particular implementation, such as the choice of switch, etc. V may be applied via the row control signals to each NVM cell or it may be provided in some other way such as with the column control signals. Sense amplifiers are arranged for each column to receive the drain current from M1 and M0 for the selected row.

In this embodiment, a high-voltage switch has to be included in every cell location in order to prevent program-disturb—changing an already-programmed cell's contents while writing a different cell. In order to overcome this drawback and make a more space-efficient NVM cell, the basic NVM cell may be reconfigured to that, shown in FIG. 13A. The FIG. 13A drawing shows the tunneling transistors as capacitors, denoted TJ1 and TJ0 and the control transistors as capacitors, denoted C1 and C0 for clarity, but they may be implemented with the pFETs as illustrated, for example, in FIGS. 1 and 2, discussed above. In this embodiment, VDD is provided at all times to bias the gates of transistors M1$d$ and M0$d$; REN (row enable); TUN and RSB (row select bar) are provided as shown in the table of FIG. 14A. The signals VDD, REN, TUN and RSB are the row control signals, although VDD need not be applied via a row and could instead be applied via a column. The column control signals comprise the data signals on lines D1 and D0 and these are applied as illustrated, for example, in the table of FIG. 14A. Other values may also be possible.

The NVM cell circuit 48 of FIG. 13A differs from the NVM cell circuit 46 of FIG. 12, in that in addition to the removal of the high-voltage switch 47 from the NVM cell 46 (because the high-voltage switching can be handled once per line, per row or column), two additional pFETs M1$d$ and M0$d$ have been added. M1$d$ and M0$d$ have their gates coupled together and to VDD and their sources, drains and well connections coupled to the corresponding sources, drains and well connections of respective readout transistors M1 and M0. This is done in order to avoid disturbing the contents of the cell when it is not selected. As can be see from the table in FIG. 14A, during read operations, the REN (row enable) line is set to VDD and with the gates of M1$d$ and M0$d$ at VDD M1$d$ and M0$d$ are not conducting and readout transistors M1 and M0 operate normally to provide an output current as a function of charge stored on corresponding floating gates $Fg_1$ and $Fg_0$. During a write operation for a different cell in the same column, REN is set to approximately half the tunneling voltage. With VDD on the gates of M1$d$ and M0$d$, M1$d$ and M0$d$ conduct, effectively connecting the drain nodes of M1 and M0 to REN. Since the drain, source and bulk nodes of both M1 and M0 are set to half the tunneling voltage, there can be no tunneling across M1 or M0. And since TUN is also set to half the tunneling voltage during this write protect mode, there can be no tunneling across TJ1 or TJ0.

To make a more space-efficient NVM cell, the prior art NVM cell is reconfigured to that shown in FIG. 13B. The FIG. 13B drawing shows the tunneling transistors as capacitors denoted TJ1 and TJ0 and the control transistors as capacitors denoted C1 and C0 for clarity but they may be implemented with the pFETs as illustrated, for example, in FIGS. 1 and 2, discussed above. In this embodiment, REN (row enable); TUN and RSB (row select bar) are provided as shown in the table of FIG. 14B. The signals REN, TUN and RSB are the row control signals The column control signals comprise the data signals on lines D1 and D0 and these are applied as illustrated, for example, in the table of FIG. 14B. Other values may also be possible.

Note the absence transistors M0$d$ and M1$d$, shown in FIG. 13A, and in FIG. 13 of issued U.S. Pat. No. 7,221,596B2. The inventors has since found that removal of these transistors has no effect of the basic operation of the NVM cell, nor does it have any detrimental effect on the program-disturb characteristic of the cell. To protect against program-disturb the behaviors of nodes N0 and N1 are important factors to be considered. Behaviors of this node are discussed next.

Figure 19:
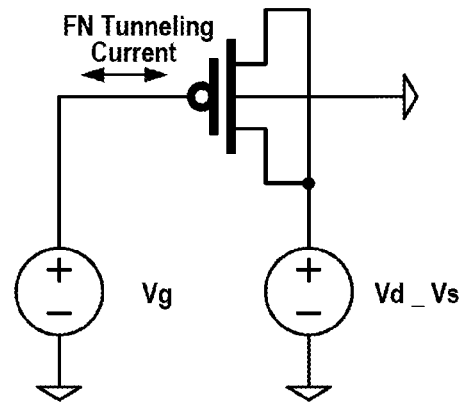
FIG. 19 is a simplified circuit diagram showing a FN tunneling current of the NVM cell.
Figure 20:
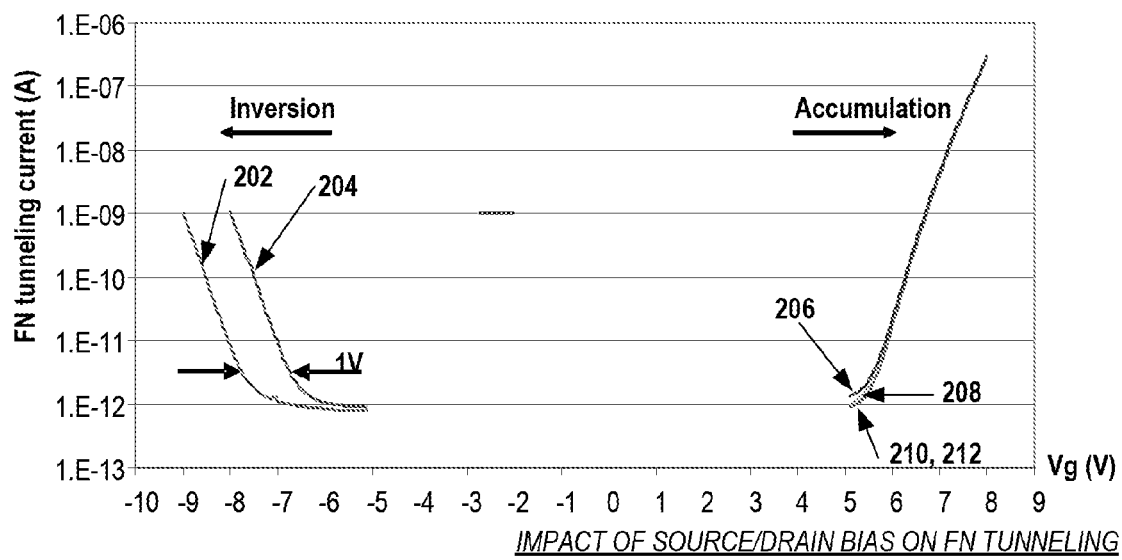
FIG. 20 is a diagram showing the impact of source/drain bias on the FN tunneling current of the NVM cell of FIG. 19.

In FIG. 19, the FN tunneling currents of transistors M0 and M1 are shown. In FIG. 20 the diagram shows the impact of source/drain bias on the FN tunneling currents. Where traces 206, 208, 210, and 212 show accumulation tunneling currents at Vd_Vs (N1) equals −3V, −2V, −1V, and 0V respectively. The diagram shows that FN tunneling current to transistor M1 is independent of N1. Therefore holding it at a particular value, for example 5V is not necessary to protect against program disturb. Traces 202 and 204 show the inversion tunneling currents at Vd_Vs (N0) equals −1V and 0V respectively. Although inversion tunneling currents show dependency of Vd−Vs, this dependency does not play any role in program disturb since node N0 is held at REN by transistor M0.

Figure 15:
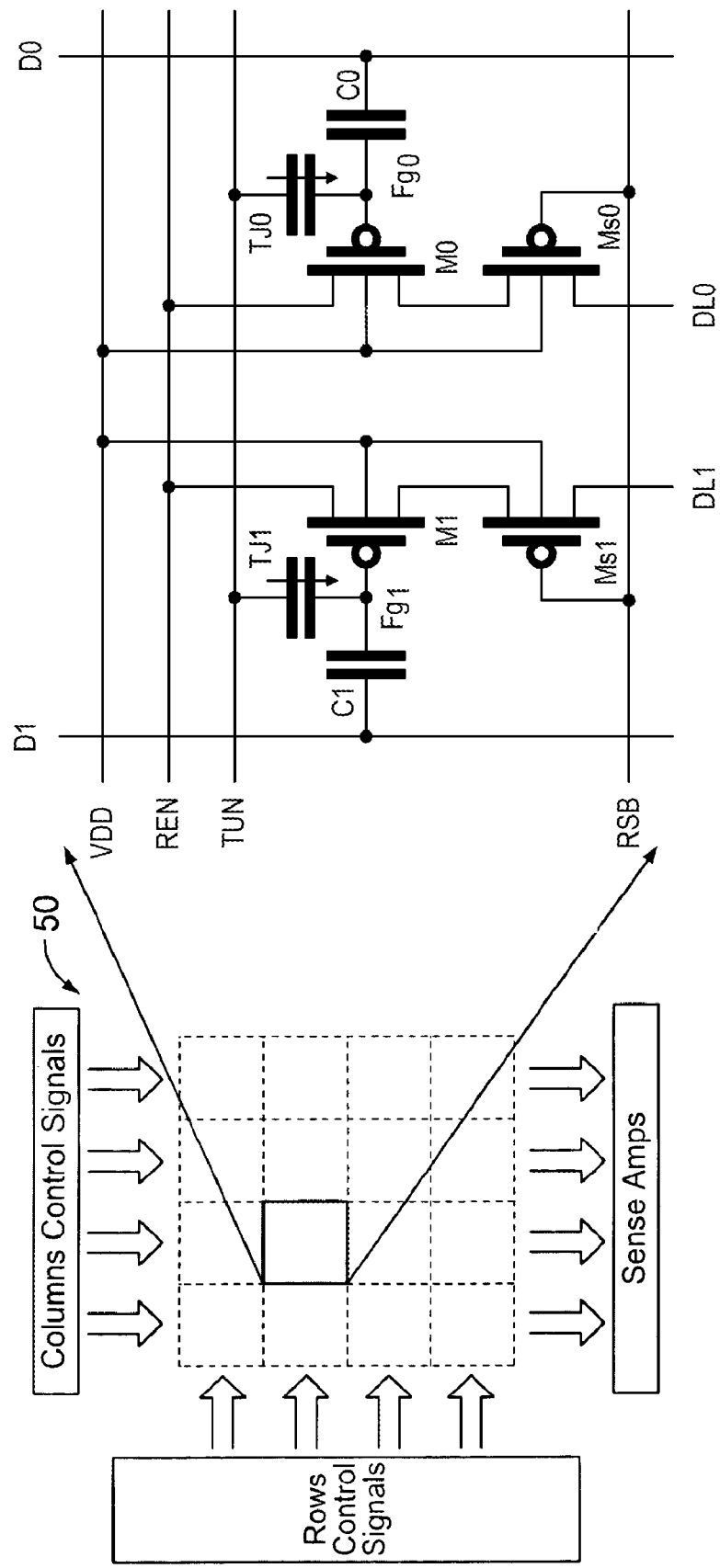
FIG. 15 is a block diagram of an array of NVM cells, in accordance with FIG. 13B, and an electrical schematic diagram of one of those cells, in accordance with an embodiment of the present invention.

Turning now to FIG. 15, an array 50 of NVM cells 48 is depicted which operates in accordance with the voltages stated in the table of FIG. 14B. Smaller minimum feature sizes and reduced oxide thickness may reduce these voltage requirements somewhat. In this array 50 the TUN, REN and RSB signals are common for a given row and comprise the row control signals while D1 and D0 are common for a given column and comprise the column control signals. Sense amplifiers (or equivalent readout circuitry) is provided for each column and reads the output currents for the selected row.

Figure 16:
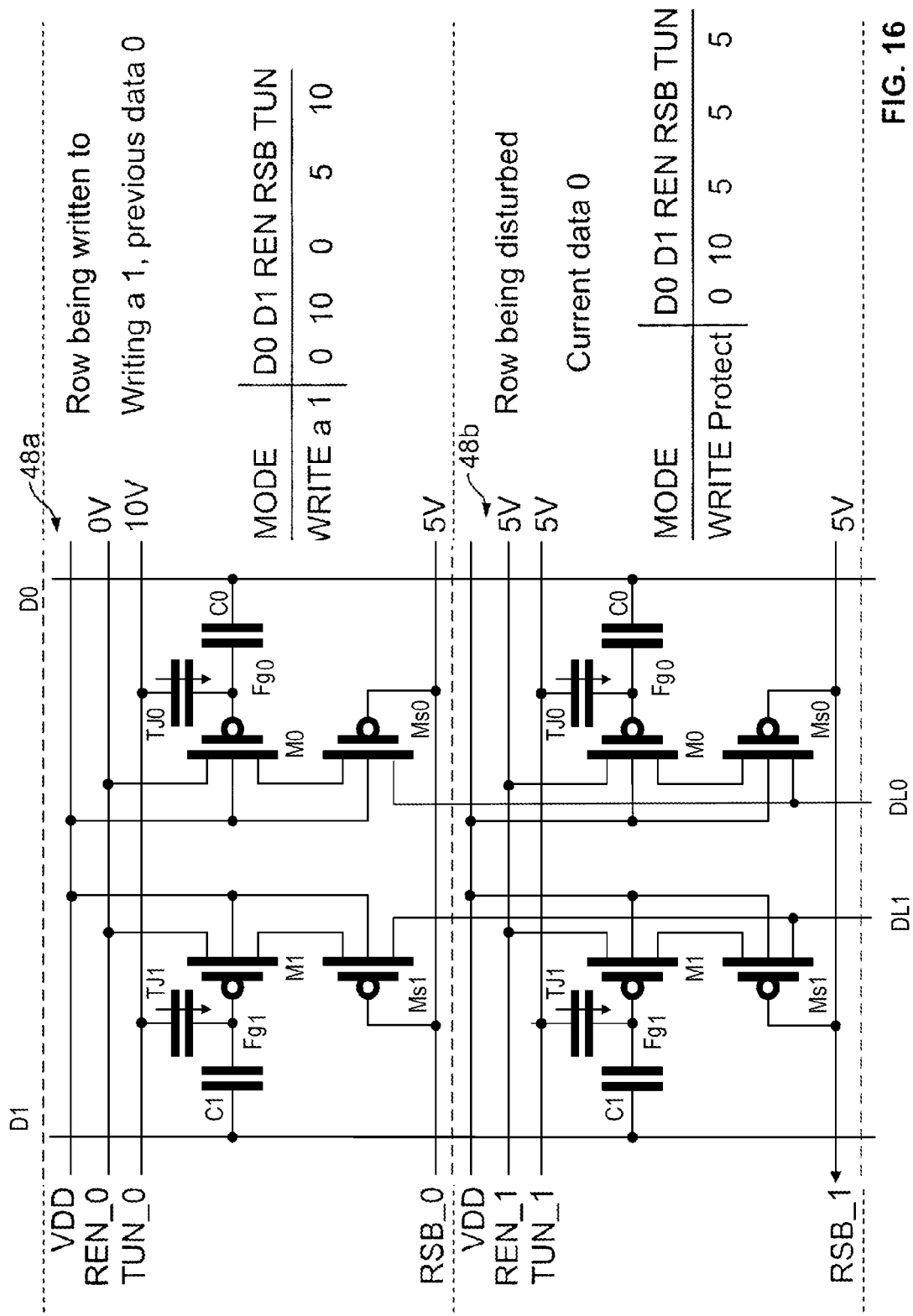
FIG. 16 is an electrical schematic diagram illustrating how the present invention avoids program disturb in respect to two adjacent NVM cells within the same column.

FIG. 16 illustrates how the present invention avoids program disturb with respect to two adjacent NVM cells 48$a$ and 48$b$ within the same column. Cell 48$a$ is having a 1 written where the previously stored data was a zero (as after the cell was erased, for example). In this case, using the figures from the table in FIG. 14B, D0=0V, D1=10V, REN_0 (for this row)=0V, RSB_0 (for this row)=5V and TUN_0 (for this row)=10V. In the adjacent cell 48$b$, to avoid disturbing already-stored data, D0=0V and D1=10V because these are in common with NVM cell 48$a$. REN_1=RSB_1=TUN_1=5V. This prevents disturb and also keeps any current from M1 and M0 of NVM cell 48$b$ from contributing to the output current.

FIG. 17 is an electrical schematic diagram of an NVM cell for use in an array of NVM cells in accordance with another embodiment of the present invention. The difference between the cell of FIG. 17 and the cell of FIG. 13B is that the well of at least some of the FET devices is not controlled directly by signal REN, but from a different signal (WELL) in the FIG. 17 embodiment. This permits more freedom in the choice of biasing condition during various states of operation. In the embodiment of FIG. 17, the TUN, REN and RSB signals are common for a given row of an array of like memory cells; the D1 and D0 signals are common for a given column of like memory cells and the WELL signal can be shared by all like memory cells in the array.

FIG. 18 is a table illustrating a set of applied voltages and operating states for the NVM cell of FIG. 17. Those of ordinary skill in the art will now realize that other values may also work.

A method of operating the cells described herein includes applying the voltage signals set forth in exemplar FIGS. 14B and 18 to the corresponding cells of FIGS. 13B and 17, respectively. The voltages are typically developed on chip using charge pumps for minimum size. Charge pumps may provide static voltages, or, more effectively, ramped voltages as are well known to those of ordinary skill in the art. In accordance with the claims set forth below, the "biasing" may be achieved with the control capacitor structure. The "charging" and "discharging" may be achieved with the tunneling capacitor structure to achieve Fowler-Nordheim tunneling. Note that the voltages set forth in FIGS. 14B and 18 are exemplary voltages for use with devices built in a 0.18 micron minimum feature size logic CMOS fabrication process technology. As technology improves, minimum feature sizes steadily decrease until some possible fundamental physical limit is ultimately reached. As these sizes decrease, the voltages used will also decrease as the same electric field can be achieved with a smaller voltage over a correspondingly smaller distance. Thus, the voltages set forth in FIGS. 14B and 18 are examples only and those of ordinary skill in the art will now realize that other voltages may be used where appropriate for the process technology used to fabricate the memory cells.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention

What is claimed is:

1. A nonvolatile memory cell in an array of memory cells, comprising:
   a first transistor having a floating gate coupled to a gate terminal, a source terminal coupled to receive a read enable signal and a drain terminal;
   a first control capacitor structure having a first terminal coupled to a first data signal line and a second terminal coupled to said first floating gate;
   a first tunneling capacitor structure having a first terminal coupled to a tunneling control signal line and a second terminal coupled to said first floating gate; and
   a first readout switch having a first terminal coupled to said drain terminal of the first transistor and a second terminal coupled to a first readout node, a control node of said first readout switch coupled to a row select signal line, the first readout switch having first current at said first terminal substantially equal to drain current of the first transistor in a mode for performing a write operation on another nonvolatile memory cell in a same column of the array of the memory cells.

2. The nonvolatile memory cell of claim 1, further comprising:
   a second transistor having a second floating gate coupled to a gate terminal, a source terminal and a drain terminal;
   a second control capacitor structure having a first terminal coupled to a second data signal line and a second terminal coupled to said second floating gate;
   a second tunneling capacitor structure having a first terminal coupled to the tunneling control signal line and a second terminal coupled to said second floating gate; and
   a second readout switch having a first terminal coupled to said drain terminal of the second transistor and a second terminal coupled to a second readout node, a control node of said second readout switch coupled to the row select signal line, the second readout switch having second current at said first terminal equal to a drain current of the second transistor in the mode.

3. The nonvolatile memory cell of claim 1, wherein the first transistor is a P-channel Field Effect Transistor (pFET).

4. The nonvolatile memory cell of claim 1, wherein the nonvolatile memory cell does not include a second transistor having a drain terminal connected to said first terminal of the first readout switch.

5. The nonvolatile memory cell of claim 1, wherein the first transistor comprises a well terminal, the memory cell further comprising:
   a read enable signal line coupled to the source terminal of the first transistor; and
   a well control signal line coupled to the well terminal of the first transistor.

6. The nonvolatile memory cell of claim 5, wherein the well control signal line is biased to a first voltage and the read enable signal line is biased to a second voltage.

7. A method for programming memory cells in an array of differential transistor nonvolatile memory cells arranged in rows and columns of cells, the method comprising:
   providing row control signals to the cells of a row of the array, the row control signals including tunneling control signals, row enable signals and row select signals;
   providing column control signals to the cells of a column of the array, the column control signals including a first and a second data signal for each cell;
   applying a first gate voltage to a first floating gate of a first transistor via a first tunneling capacitor structure and a first control capacitor structure, the first tunneling capacitor coupled between a tunneling control signal line and the first floating gate, the first control capacitor structure coupled between a first data signal line and the first floating gate;
   applying a second gate voltage to a second floating gate of a second transistor via a second tunneling capacitor structure and the second control capacitor structure, the second tunneling capacitor coupled between the tunneling control signal line and the second floating gate, the second control capacitor structure coupled between a second data signal line and the second floating gate;
   generating a first readout current at a first terminal of a first readout switch responsive to receiving a row select signal, said first terminal of the first readout switch coupled to a drain terminal of the first transistor, said first readout switch having a second terminal coupled to a first readout node and a control node of said readout switch for receiving a row select signal, wherein the first readout current at said first terminal of the first readout switch is substantially equal to drain current of the first transistor in a mode for performing a write operation on another nonvolatile memory cell in a same column of the array; and
   generating a second readout current at a first terminal of a second readout switch responsive to receiving the row select signal, said first terminal of the second readout switch coupled to a drain terminal of the second transistor, said second readout switch having a second terminal coupled to a second readout node and a control node of said readout switch for receiving a row select signal, wherein the second readout current at said first terminal of the second readout switch is substantially equal to drain current of the second transistor in the mode.

8. The method of claim 7, in which
   the tunneling control signals are voltage signals sufficient to cause Fowler-Nordheim tunneling across a dielectric insulating the first and second floating gates.

9. The method of claim 7, wherein the first and second transistors are P-channel Field Effect Transistors (pFETs).

10. The method of claim 7, wherein each of the first and second transistors comprises a well terminal, each differential nonvolatile transistor memory cell in the array further comprising:
 a read enable signal line coupled to the source terminals of the first and second transistors; and
 a well control signal line coupled to the well terminals of the first and second transistors.

11. The method of claim 10, wherein the well control signal line is biased to a first voltage and the read enable signal line is biased to a second voltage.

12. The method of claim 7, wherein the differential transistor nonvolatile memory cells do not include a third and fourth transistors having common gates coupled to a high voltage source and drain terminals connected to said first terminal of the first readout switch or said first terminal of the second readout switch.

13. An apparatus for programming memory cells in an array of differential transistor nonvolatile memory cells arranged in rows and columns of cells, the apparatus comprising:
 means for providing row control signals to the cells of a row of the array, the row control signals including tunneling control signals, row enable signals and row select signals;
 means for providing column control signals to the cells of a column of the array, the column control signals including a first and a second data signal for each cell;
 means for applying a first gate voltage to a first floating gate of a first transistor via a first tunneling capacitor structure and a first control capacitor structure, the first tunneling capacitor coupled between a tunneling control signal line and the first floating gate, the first control capacitor structure coupled between a first data signal line and the first floating gate;
 means for applying a second gate voltage to a second floating gate of a second transistor via a second tunneling capacitor structure and the second control capacitor structure, the second tunneling capacitor coupled between the tunneling control signal line and the second floating gate, the second control capacitor structure coupled between a second data signal line and the second floating gate;
 means for controlling current from a drain of the first transistor to a first read out node responsive to receiving a row select signal, the means for controlling current having first current at a first terminal substantially equal to drain current of the first transistor in a mode for performing a write operation on another nonvolatile memory cell in a same column of the array; and
 means for controlling current from a drain of the second transistor to a second read out node responsive to receiving a row select signal, the means for controlling current having second current at a second terminal substantially equal to drain current of the second transistor in the mode.

14. The apparatus of claim 13, in which
 said tunneling control signals are voltage signals sufficient to cause Fowler-Nordheim tunneling across a dielectric insulating the first and second floating gates.

15. The apparatus of claim 13, wherein the first and second transistors are P-channel Field Effect Transistor (pFETs).

16. The apparatus of claim 13, wherein the first and second transistors each comprise a well terminal and a source terminal, each differential transistor memory cell in the array further comprising:
 a read enable signal line coupled to the source terminals of the first and second transistors; and
 a well control signal line coupled to the well terminals of the first and second transistors.

17. The apparatus of claim 16, wherein the well control signal line is biased to a first voltage and the read enable signal line is biased to a second voltage.

18. The apparatus of claim 13, wherein the differential transistor nonvolatile memory cells do not include third and forth transistors having a common gate coupled to a high voltage source and drain terminals connected to said first terminal or said second terminal.

* * * * *